US012625174B2

(12) United States Patent
Glinka et al.

(10) Patent No.: US 12,625,174 B2
(45) Date of Patent: May 12, 2026

(54) ASSESSMENT OF METALLIC STRUCTURES IN CONTACT WITH AN ELECTROLYTE

(71) Applicant: Electromagnetic Pipeline Testing GmbH, Berlin (DE)

(72) Inventors: Mark Glinka, Berlin (DE); Albin Hertrich, Berlin (DE); Jan Strom, Berlin (DE); Bruno Schulz, Berlin (DE); Alexander Kroll, Berlin (DE)

( * ) Notice: Subject to any disclaimer, the term of this patent is extended or adjusted under 35 U.S.C. 154(b) by 204 days.

(21) Appl. No.: 18/770,608

(22) Filed: Jul. 11, 2024

(65) Prior Publication Data
US 2025/0067783 A1     Feb. 27, 2025

(30) Foreign Application Priority Data
Aug. 22, 2023     (EP) .................................... 23192759

(51) Int. Cl.
*G01N 27/20*          (2006.01)
*G01N 27/30*          (2006.01)
          (Continued)

(52) U.S. Cl.
CPC ......... *G01R 29/0814* (2013.01); *G01N 27/20* (2013.01); *G01N 27/301* (2013.01);
          (Continued)

(58) Field of Classification Search
CPC ........... G01R 29/0814; G01R 29/0892; G01N 27/20; G01N 27/301; G01N 27/4166; G01N 17/006; G01N 17/02
          (Continued)

(56) References Cited

U.S. PATENT DOCUMENTS 4,134,061 A * 1/1979 Gudgel .................... G01V 3/02
                                              324/559
4,220,913 A * 9/1980 Howell .................. G01R 31/58
                                              324/529
          (Continued)

FOREIGN PATENT DOCUMENTS

CN        110066997        7/2019
CN        209784244        12/2019
JP          5565288        8/2014

OTHER PUBLICATIONS

May, Zazilah, Md Khorshed Alam, and Nazrul Anuar Nayan. "Recent advances in nondestructive method and assessment of corrosion undercoating in carbon-steel pipelines." Sensors 22.17 (2022): 6654. 30 pages. (Year: 2022).
          (Continued)

*Primary Examiner* — Arleen M Vazquez
(74) *Attorney, Agent, or Firm* — SLEMAN & LUND LLP

(57)          ABSTRACT

A method for assessing a structure arranged in an electrolyte may include connecting an electric source between the structure and an earth, and imposing, on the structure, a primary current with at least three frequencies including a first frequency of a duration and an amplitude, a second frequency of a duration and an amplitude, and a third frequency of a duration and an amplitude, a series of currents with the first and second frequency being separated by a time gap. Fields of electric fields may be measured with an instrument having first, second, and third sensors and a positioning system. Each sensor May be configured to measure a field of an electromagnetic field along the structure for each of the frequencies. A primary field resulting from an electric current within the structure based on the measured field may be computed.

20 Claims, 8 Drawing Sheets

(51) Int. Cl.
  *G01N 27/416* (2006.01)
  *G01R 29/08* (2006.01)
  *G01N 17/00* (2006.01)
  *G01N 17/02* (2006.01)
(52) U.S. Cl.
  CPC ..... *G01N 27/4166* (2013.01); *G01R 29/0892* (2013.01); *G01N 17/006* (2013.01); *G01N 17/02* (2013.01)
(58) Field of Classification Search
  USPC ....................................................... 324/76.11
  See application file for complete search history.

(56) References Cited

U.S. PATENT DOCUMENTS

| | | | | |
|---|---|---|---|---|
| 4,390,836 | A | * | 6/1983 | Bruce .................... G01R 31/58 |
| | | | | 324/559 |
| 4,752,360 | A | | 6/1988 | Jasinski |
| 5,087,873 | A | | 2/1992 | Murphy |
| 5,469,048 | A | | 11/1995 | Donohue |
| 6,365,034 | B1 | | 4/2002 | Spellane |
| 6,577,112 | B2 | | 6/2003 | Lvovich |
| 2003/0146749 | A1 | | 8/2003 | Srinivasan |
| 2003/0169058 | A1 | | 9/2003 | Pierre |
| 2006/0109007 | A1 | * | 5/2006 | Takach .................. G01V 11/00 |
| | | | | 324/326 |
| 2010/0039127 | A1 | | 2/2010 | Orazem |
| 2017/0108469 | A1 | | 4/2017 | Timmons |
| 2019/0101502 | A1 | | 4/2019 | Aziz |
| 2022/0128454 | A1 | | 4/2022 | Räftegård |
| 2022/0260548 | A1 | | 8/2022 | Rodrigues |

OTHER PUBLICATIONS

Xu, L. Y., et al. "Development of a real-time AC/DC data acquisition technique for studies of AC corrosion of pipelines." Corrosion Science 61 (2012): 215-223. (Year: 2012).

* cited by examiner

ASSESSMENT OF METALLIC STRUCTURES IN CONTACT WITH AN ELECTROLYTE

CROSS-REFERENCE TO RELATED APPLICATIONS

This application claims priority to European Patent Application No. 23192759.1, filed Aug. 22, 2023, the disclosure of which is hereby incorporated by reference herein.

FIELD OF THE INVENTION

The present invention relates to a method for assessing a structure arranged in an electrolyte and a system for assessing the structure arranged in an electrolyte.

BACKGROUND OF THE INVENTION

Longitudinal metallic structures like pipelines, for the transport of liquid or gaseous media, or cables for the transport of electrical power or communication information, are usually located within soil or immersed in water. Other longitudinal metallic structures are rails and tracks of transportation systems that are installed e.g. on a gravel bed. Further longitudinal metallic structures are tendons, anchors or stay cables of bridges that are installed in grout, concrete or grease. All these structures have in common that the soil, water, rock, gravel, sand, grout, concrete, condensed humidity etc., hereinafter referred to as "electrolyte", causes contact to the structure and results in a physicochemical reaction with the structure. However, it has been shown that gaining knowledge about the current state of the structure can be cumbersome requiring complex procedures.

SUMMARY OF THE INVENTION

There may thus be a need to provide a reliable assessment of a structure in an electrolyte.

The object of the present invention is solved by the subject-matter of the independent claims; further embodiments are incorporated in the dependent claims. It should be noted that the following described aspects of the invention apply also for the method for assessing a structure arranged in an electrolyte and for the system for assessing a structure arranged in an electrolyte.

According to the invention, a method for assessing a structure arranged in an electrolyte is provided. The method comprises the following steps:

Connecting an electric source between the structure and an earth;

Imposing, on the structure, a primary current with at least three frequencies comprising a first frequency of a first duration and of a first amplitude, a second frequency of a second duration and of a second amplitude and a third frequency of a third duration and of a third amplitude; wherein a series of currents with the first frequency, the second frequency and the third frequency are separated by a time gap;

Measuring the strength (hereinafter referred to as field) of electromagnetic fields with an instrument comprising at least a first sensor, a third sensor and a fourth sensor and a positioning system; wherein each sensor is configured to measure a field along the structure for each of the at least three frequencies; wherein the sensors are provided in parallel spatial orientation to each other; and Computing at least one primary field resulting from an electric current within the structure based on the measured field.

In an option, the three individual sensors are supplemented by another three sensors, which are rotated by an angle, e.g. 90°. This results in six sensors and they can measure a secondary field generated by a secondary current in addition to the primary field generated by the primary current.

In an example, additional seventh, eight and nineth sensors are positioned at an angle to the first, third and fourth parallel sensors. In an example it is provided: Measuring fields with an instrument in two spatial orientations.

In an example, additional twelfth, thirteenth and fourteenth sensors are positioned at an angle to the plane described by the first sensor and the seventh sensor. In an example it is provided: Measuring fields with an instrument in three spatial orientations.

In an example the first, seventh and twelfth sensor are combined into a sensor array.

In an example, it is provided: Measuring fields with an instrument comprising at least three sensor arrays, wherein each sensor array comprises at least three sensors. In an example the first sensor array comprises the first, the seventh and the eleventh sensor in three different spatial orientations, the second sensor array comprises the third, the eight and the thirteenth sensor in three different spatial orientations, the third sensor array comprises the fourth, the nineth and the fourteenth sensor in three different spatial orientations, as well as a positioning system.

According to an example, the method further comprises the step of locating the structure by detecting a primary field generated by a primary current of the first frequency, the second frequency and the third frequency within the structure.

According to an example, the method further comprises the step of identifying a holiday by detecting a secondary field generated by a secondary current of the first frequency, the second frequency and the third frequency. For example, this is provided by a fifth sensor that is at an angle, such as perpendicular, relative to the first sensor.

According to an example, the method further comprises:

Establishing a time synchronization between the source and the instrument.

According to an example, for measuring, the following steps are provided:

Establishing a time synchronization between the source with a first communication and an instrument with a second communication;

Measuring a field for the first frequency for a duration of up to a first duration with the first sensor, the third sensor and the fourth sensor with a rate of at least four times the first frequency; and Measuring a field for the second frequency for a duration of up to the second duration with the first sensor, the third sensor and the fourth sensor with a rate of at least four times the second frequency; and Measuring a field for the third frequency for a duration of up to a third duration with the first sensor, the third sensor and the fourth sensor with a rate of at least four times the third frequency; and Calculating at least one physical property for the structure based on the measured fields.

The synchronization generates a connection between the source and the measuring instrument without requiring a physical connection.

In an example, the method further comprises:

Detecting of the fields by the first sensor array, the second sensor and the third sensor array in all three spatial coordinates; each one of the three sensor arrays are provided at three different sensors in different spatial orientations, which are for example parallel and perpendicular to the structure.

As an option, it is further provided:

Determining the fields measured by the first sensor array, the second sensor array and the third sensor array generated by the primary current and the secondary current passing through the holiday from the structure into the electrolyte for at least the first frequency at least every 1 m (meter) along the structure; and Identifying of the position of the holiday based on the determination of the primary and the secondary field; the precision of detection is increased with decreasing the distance for individual measurements of the fields by the sensors along the structure from 1,00 m to 0,01 m.

According to an example, the method further comprises:

Determining of at least one local phase to identify and localize a holiday within the structure.

According to an example, to determine of the at least one local phase, a predefined model is provided for computing the at least one local phase based on the measured fields.

According to an example, to determine of the at least one local phase, the at least one local phase is computed based on measured phase shifts.

According to an example, the method further comprises:

Measuring of a first phase shift, a second phase shift and a third phase shift of the at least three frequencies imposed by the source and the measured fields by the first sensor array, the second sensor array and the third sensor array generated by the primary current and the secondary current, based on the first communication and the second communication between the source and the instrument.

According to an example, the method further comprises:

Calculating the primary current in the structure by the fields measured with the at least three sensors and as well as the phase shift, based on the first communication and the second communication between the source and the instrument;

Modelling the fields measured by the at least three sensors taking into account the first phase shift, the second phase shift and a third phase shift that allow to assess the contribution of a metallic component to the measured fields; and Calculating the primary current in the structure based on the modelled field distribution.

According to an example, the method further comprises:

Calculating the first potential and the second potential for the first frequency, the second frequency and the third frequency along the structure by the following steps:

Calculating the longitudinal resistivity based on the type of metal and the metallic section of the structure; and Calculating the first potential and the second potential along the structure by the primary current for at least the first frequency, the second frequency and the third frequency. In an option, also the third potential along the structure by the primary current is calculated. The calculation of the first amplitude, the second amplitude and the third amplitude of the primary current for the first frequency, the second frequency and the third frequency along the structure is assessed with the at least three sensors.

According to an example, the method further comprises:

Calculating of the first amplitude, the second amplitude and the third amplitude of the secondary current passing from the structure through the holiday into the electrolyte by the fields measured with the at least three sensors as well as the phase shift; and by the following steps:

Modelling the secondary field measured by the at least three sensors taking into account the first phase shift, the second phase shift and the third phase shift that allows to assess the contribution of a metallic component to the measured fields; and Calculating the first amplitude, the second amplitude and the third amplitude of the secondary current for the at least three frequencies passing from the structure through the holiday into the electrolyte.

According to an example, the method further comprises:

Determining of the presence of a protective layer in the holiday, based on a determination of a first impedance, a second impedance and optional a third impedance and the first phase shift, the second phase shift and optional a third phase shift, by the following steps:

Calculating the first impedance and the second impedance and the optional third impedance of the holiday by dividing the first potential on the structure at the position of the holiday by the first amplitude of the secondary current, by dividing the second potential on the structure at the position of the holiday by the second amplitude and by dividing the third potential on the structure at the position of the holiday by the third amplitude of the secondary current for the least three frequencies; and Evaluating of the frequency dependency of the first impedance, the second impedance and the third impedance as well as the first phase shift, the second phase shift and the third phase shift for the assessment of the presence of the protective layers within the holiday.

According to an example, the method further comprises:

Demonstrating of the good bedding condition of the holiday, based on the change of the amplitude to the amplitude of the primary current generated by the source based on the first communication and the second communication with the instrument, by the following steps with a first amplitude being applied:

Determining the first impedance and the second impedance and the third impedance of the holiday at the amplitude;

Sending a command from the instrument to the source via the first communication and the second communication, wherein the amplitude of the primary current is increased to an increased amplitude;

Determining the first impedance and the second impedance and the third impedance of the holiday at the increased amplitude as a function of time; and Sending a command from the instrument to the source via the first communication and the second communication, wherein the increased amplitude of the primary current is decreased to the amplitude; the first impedance and the second impedance and the third impedance of the holiday are determined at the amplitude;

Evaluating the time evolution of the first impedance and/or the second impedance and/or the third impedance; wherein a first impedance and/or a second impedance and/or a third impedance that varies with time is a demonstration of a good bedding condition and an ability to accumulate hydroxide ions and thereby generate a zone with high pH, a zone with increased pH and a zone with small increase of pH; the generation of the zones results at least in the first impedances being different at different amplitudes. According to an example, the method further comprises:

Demonstrating the presence of a protective layer on the structure in contact with the electrolyte within the holiday, based on the change of the first amplitude of the primary current generated by the source based on the first communication and the second communication with the instrument, by the following steps:

Setting the amplitude of the selected first frequency to the first amplitude;

Determining the secondary field by the at least three sensors arrays with a frequency of at least four times of the first frequency;

Calculating the first amplitude of the secondary current;

Determining the average of the first amplitude over a multiple of the period of 1/first frequency resulting in a first apparent DC current at the first amplitude;

Changing the amplitude of the selected first frequency to the first amplitude; the secondary field is determined by the at least three sensor arrays with a frequency of at least four times the first frequency.

Averaging the recorded data taken over a multiple of the period of 1/first frequency resulting in the first apparent DC current at the changed first amplitude; and Determining a presence of the protective layer by an evaluation of the assessment of the first amplitude subtracted by the changed first amplitude and the first apparent DC current subtracted by the changed first apparent DC current.

According to an example, the method further comprises:

Minimizing the touch potential of a pipeline during the measurement, based on the change of the first amplitude and the second amplitude and the third amplitude of the primary current for all of the at least three frequencies generated by the source based on the first communication and the second communication with the instrument, by the following step:

Temporarily changing the first amplitude, the second amplitude and the third amplitude, the first duration, the second duration and the third duration as well as the first time gap, the second time gap and the third time gap of the at least three frequencies by increasing the first amplitude, the second amplitude and the third amplitude and increasing the first time gap, the second time gap and the third time gap as well as decreasing the first duration, the second duration and the third duration by the first communication and the second communication between the source and the instrument.

According to the invention, also a system for assessing a structure arranged in an electrolyte is provided. The system comprises a source with an electric output terminal configured for connection to the structure, an electric output terminal configured for connection to earth. The source is configured to provide a current with at least three frequencies at least within the structure. The system further comprises an instrument with at least a first sensor, a second sensor and a third sensor in a known spatial relation. For example, the first sensor, the second sensor and the third sensor are provided in parallel. In another example a first, a second and a third sensor arrays are positioned at known orientation and position in the instrument. Each sensor or sensor array is configured to measure a field of an electric field along the structure for each of the at least three frequencies. The system also comprises a positioning and orientation system configured to provide position and orientation data of the instrument. The system also comprises a processing unit in data communication with the source and the instrument. The processing unit is configured to compute at least one primary field resulting from an electric current within the structure based on the measured field.

In an option, the processing unit is configured to compute at least one primary field based on detecting differences of the fields measured with the first, second and third sensor in order to compute values of the field in order to locate the structure.

In an option, the three sensors are arranged in a parallel setting. In another option, additional three sensors are arranged transverse to the first three sensors.

As an example, the instrument is arranged transverse, e.g. perpendicular, to a longitudinal extension of the structure, such as a pipeline or conduit. For example, the instrument is arranged plane to an earth surface, e.g. in a horizontal manner.

The electric field is caused by the current in the structure provided by the source.

In an example, the at least three frequencies are provided as F1 to Fn.

In an example, the frequency portions are resolved over the time domain. By providing at least three sensors at different locations for field measurement for the primary current at one, i.e. the same, instant in time, the frequency portions are also resolved geometrically.

The electric fields occur for each of the frequencies. The electric fields are measured by each of the sensor, i.e. at different locations.

As an option the three sensors are replaced by three sensor arrays, each containing three sensors oriented in three spatial orientations. The sensor arrays allow for measurement of the primary and the secondary current.

As an option, the source is providing a multifrequency current supplied to the structure.

According to an example, the source is configured to provide the current as a primary current with at least three frequencies comprising a first frequency of a first duration and of a first amplitude, a second frequency of a second duration and of a second amplitude and a third frequency of a third duration and of a third amplitude; wherein a series of currents with the first frequency, the second frequency and the third frequency are separated by a time gap.

According to an example, the instrument measures at least three different fields at each of the at least three sensors for the at least three frequencies.

As an example, for three frequencies:

The first sensor measures a first field for the first frequency; the second sensor measures a second field for the first frequency; and the third sensor measures a third field for the first frequency.

The first sensor measures a first field for the second frequency; the second sensor measures a second field for the second frequency; and the third sensor measures a third field for the second frequency.

The first sensor measures a first field for the third frequency; the second sensor measures a second field for the third frequency; and the third sensor measures a third field for the third frequency.

Thus, as an example, nine combinations are actually measured: For the first frequency, the first sensor measures an electric field, the second sensor measures an electric field, and the third sensor also measures an electric field. For the second frequency, the first sensor measures an electric field, the second sensor measures an electric field, and the third sensor also measures an electric field. For the third frequency, the first sensor measures an electric field, the second sensor measures an electric field, and the third sensor also measures an electric field.

In case of more than three frequencies, respectively more electric fields are measured at each of the sensors.

In case of more than three sensors, respectively more electric fields are measured at the sensors for each frequency.

In an example, 18 measurements are provided in combinations (see also FIG. 2). In another example, 27 measurements are provided in combinations (see also FIG. 3).

In case of an structure with intact coating, basically only a primary current will occur, resulting in the generation of a primary electric field for each frequency. The field can then be measured at each sensor. The differences in combination with data from the positioning unit allow the computation of the location of the field and thus the structure.

In case of a structure with holidays in its coating consisting of an insulation outer layer, one or more secondary currents may occur, resulting in the generation of at least one secondary field for each frequency. The field for the two or more fields (one primary field and one or several secondary fields) can then be measured at each sensor. The differences in combination with data from the positioning unit allow the computation of the location of the primary field and the secondary field and thus the location of holidays in the enclosure of the structure.

The third sensor in each sensor array allows to differentiate the main signal from external noise and interference. This also improves to identify the main signal relating to the primary current within the structure and the leakage or drain signal relating to the secondary current due to holidays in the structure.

In an example, the main function of the sensors is to detect the location of the structure.

In another example, an additional function of the sensors is to also detect holidays within the structure.

In an option, in addition to the first sensor, the second sensor and the third sensor that are parallel, at least three further sensors are provided in a different spatial orientation.

In an example, the first sensor, the second sensor and the third sensor are arranged in parallel. The additional parallel the fourth, fifth and sixth sensor are also perpendicular to the first sensor, the second sensor and the third sensor.

In an example, the first sensor, the second sensor and the third sensor are forming a first sensor array. A second array is provided comprising three sensors, wherein the second array is arranged in a same plane as the first sensor array, but transverse to the first sensor array. A third array is provided comprising three sensors, wherein the third array is arranged transverse to the first sensor array and the second sensor array.

According to an example, a seventh sensor and a twelfth sensor are combined with the first sensor, forming a first sensor array. The seventh sensor is at an angle to the first sensor and the twelfth sensor is at an angle to the plane described by the first and the seventh sensor. These angles are often chosen to be 90°.

As an example, during operation of the system, the first sensor array and the second sensor array are arranged more or less parallel to an area surface where the structure is arranged, i.e. the earth's surface.

In an option, a system for assessing a structure arranged in an electrolyte is provided. As an example, the system is configured for assessing the structure according to the method of one of the examples above. The system comprises:
a source with:
an electrical output connecting to an earth;
an electrical output connecting to the structure; and
a first communication; and
an instrument with:
a sensor arrangement with at least three sensors allowing for measurement of a first field, a second field and a third field along the structure in all three spatial coordinates;
at least one second communication; and
a positioning and orientation system.

In an example, the at least three sensors are provided at an angle to each other.

In an example, an additional sensor is positioned at an angle to the plane described by the first sensor and the second sensor. The three sensors are combined into a sensor array.

In an example, the sensor arrangement comprises at least three sensor arrays.

In another example, a method for assessing a structure arranged in an electrolyte is provided. The method comprises the steps: Connecting an electric source between the structure and an earth; Imposing a primary current with at least three frequencies comprising a first frequency of a first duration and of a first amplitude, a second frequency of a second duration and of a second amplitude and a third frequency of a third duration and of a third amplitude; a series of currents with the first frequency and the second frequency and the third frequency are separated by a time gap; Measuring a primary field, i.e. a field of the primary field, of the first frequency and the second frequency and the third frequency generated by the primary current with an instrument comprising at least a first sensor, a second sensor and a third sensor and a positioning system by the following steps: Establishing a time synchronization between the source with a first communication and an instrument with a second communication; Measuring a first field, i.e. a field of the primary field for the first frequency for a duration of up to a first duration with the first sensor, the second sensor and the third sensor with a rate of at least four times the first frequency; and Measuring a second field, i.e. a field of the primary field for the second frequency for a duration of up to the second duration with the first sensor, the second sensor and the third sensor with a rate of at least four times the second frequency; Measuring a third field, i.e. a field of the primary field for the third frequency for a duration of up to a third duration with the first sensor, the second sensor and the third sensor with a rate of at least four times the third frequency; and Calculating at least one physical property for the structure based on the measured field.

The term "assessing" relates to at least one of the group of localizing, determining a distance of the structure, identifying holidays on the structure, presence of protective layers and the good bedding of the holiday and therefore the external corrosion assessment of a structure in contact with an electrolyte.

The physical property comprises at least one of the group of: position of the structure, distance to the structure, identifying holidays on the structure, presence of protective layers and the good bedding of the holiday and therefore the external corrosion assessment of a structure in contact with an electrolyte.

In an example, the method further comprises: Identifying a holiday by detecting a secondary field generated by a secondary current of the first frequency, the second frequency and the third frequency; for the measuring of the fields, the at least three sensors are provided at an angle to each other.

In an example, the method further comprises: Detecting of the first field, the second field and the third field in all three spatial coordinates; an additional sensor is positioned at an angle to the plane described by the first sensor and the second sensor; and the three sensors are combined into a sensor array.

As an option, the method further comprises: Determining the first field, the second field and the third field generated by the primary current and the secondary current passing through the holiday from the structure into the electrolyte for at least the first frequency at least every 1 m along the structure; at least three sensor arrays are combined into the instrument; and Identifying of the position of the holiday based on the determination of the secondary field; the precision of detection is increased with decreasing the distance for individual measurements of the first field and the secondary field along the structure from 1,00 m to 0,01 m.

In an example, the method further comprises: Calculating the primary current in the structure by the first field measured with the at least three sensors and as well as the phase shift, based on the first communication and the second communication between the source and the instrument; Modelling the field measured by the at least three sensors taking into account the first phase shift and the second phase shift and the third phase shift that allow to assess the contribution of a metallic component to the measured field; and Calculating the primary current in the structure based on the modelled field distribution.

This provides information with respect to the corrosion protection of the holiday.

The identification and localization of holidays is a key aspect of external corrosion direct assessment (ECDA), and the reliability of alternating current voltage gradient (ACVG), direct current voltage gradient (DCVG) as well as current attenuation measurement (CAM) as survey techniques are significantly affected by external conditions and in particular metallic components in the ground. However, even if these methods would have a very high reliability with respect to the identification of coating defects, they do not provide any information with respect to a corrosion protection within the holidays. The presence of a holiday only indicates the contact between the structure and the electrolyte and the possibility of corrosion. In case of structures equipped with cathodic protection, the pH increases (increase of alkalinity) at the metal surface of the structure and the subsequent formation of protective layers comprising metal oxides in holidays bedded in fine sand and/or calcium carbonates reliably prevent corrosion. The presence of sand, soil and/or calcium carbonate layers is hereinafter referred to as "good bedding" and the formation of protective oxide or carbonate films is hereinafter referred to as "protective layers". Correspondingly, it is not meaningful with respect to an economic structure operation to eliminate all identified holidays by excavation and coating repair. Instead, a method is provided that does not only allow for localization of the structure and identification of holidays, but provides further information with respect to the bedding conditions, the presence of calcium carbonate layers, the pH increase, the formation of protective oxide films, the size of the holidays and their resistance for current flow into the electrolyte hereinafter referred to as "spread resistance". Based on this information, a full assessment of the corrosion situation can be obtained and a more complete ECDA is achieved.

This procedure allows for significantly increased short term levels of the first potential and the second potential on the pipeline without generating a problem with respect to protection of persons or AC corrosion.

This procedure allows furthermore, the determination of the secondary current passing from the structure through the holiday into the electrolyte at the changed first amplitude, when the first amplitude does not provide sufficient resolution for reliable calculation of the first impedance and the second impedance or the first phase shift and the second phase shift.

In an example, also a system for assessing a structure arranged in an electrolyte according to the method of one of the examples above is provided. The system comprises a source with an electrical output connecting to an earth, an electrical output connecting to the structure and a first communication. The system also comprises an instrument with a sensor arrangement with at least three sensors allowing for measurement of a first field, a second field and a third field along the structure, at least one second communication and a positioning and orientation system.

The assessing may comprise at least one of the group of: localizing the structure, determining a distance of the structure, identifying holidays on the structure, presence of protective layers and the good bedding of the holiday and therefore the external corrosion assessment of a structure in contact with an electrolyte.

In an example, the at least three additional sensors are provided at an angle to first three sensors.

In an option, further sensors are provided at an angle to the first six sensors.

In an example, an additional sensor is positioned at an angle to the plane described by the first sensor and the fifth sensor. Further, three sensors with different spatial orientation are combined into a sensor array.

In an example, the sensor arrangement comprises at least three sensor arrays.

In an option, the at least three sensor arrays are combined into the instrument.

In an example, sensors are arranged transvers to a longitudinal direction of the structure.

In an example, sensors are arranged perpendicular to a longitudinal direction of the structure.

In another example, sensor arrays are arranged transvers to a longitudinal direction of the structure. In an example, sensor arrays are arranged perpendicular to a longitudinal direction of the structure.

The instrument is configured to be moved along the length of the structure.

The main object of the invention is to localize the structure in the electrolyte, identify holidays along the structure and determine the presence of protective layers as well as the corrosion protection. Corrosion protection is ensured by the good bedding of the holiday allowing for pH-increase and the formation of protective layers. This is achieved by the connection of a source injecting a current between earth and the structure comprising at least three frequencies f1, f2, f3 to fn and measurement of the distribution of the associated field with at least three sensors. The amplitude of the current of each of frequency f1 to fn corresponds to amplitude A1 to amplitude An. Several of these sensors are combined to allow for measurement of the field in all three spatial coordinates with a high time resolution of at least 1 kHz up to 1 GHz. These three combined sensors are hereinafter referred to as "sensor array". Several of these sensor arrays are combined into a measurement instrument, hereinafter referred to as "instrument". The measurement is performed along the structure with a lateral resolution of less than 1 m and more than 1 μm. Ideal measurement intervals along the structure are usually in the range of 1 cm.

The advantage of the invention is that, by a time resolved field measurement with several sensor arrays in the instrument, the secondary current leaking from the structure through the holiday into the electrolyte, and hence the position of the holidays, can be detected without contact to the electrolyte. This does not only allow to perform measurements on paved surfaces but also the application of the invention on airborne instruments such as airplanes, helicopters and drones. The high time resolution of the at least three sensor arrays allows to identify the current of the various frequencies f1 to fn generated by the source as well as the determination of the phase shift, hereinafter referred to as DEG, between current generation of the source and field detection by the instrument for each frequency f1 to fn. The determination of the phase shift DEG is possible through initial or continuous time synchronization between the instrument and the source. This time synchronization requires permanent or at least temporary communication between the source and the instrument for ensuring the precision required for assessment of the phase shift DEG. The combination of a source generating currents with frequencies f1 to fn with the detection at high time resolution in all three spatial coordinates on several sensor arrays allows for very high precision of the current measurement parallel and perpendicular to the structure. The high time resolution in the range of at least 1000 Hz on at least three sensor arrays provides highest precision in field measurement by allowing for elimination and treatment of interfering fields. Additionally, a high spatial resolution of less than 1 m and ideally in the range of 1 cm ensures the information for high precision in assessment of the electrical field and hence calculation of the current. Since the sensor arrays allow to resolve the field in all three spatial coordinates, it is not only possible to determine the primary current along the structure, but also the secondary current passing through the holiday into the electrolyte. The vectorial component of these currents of the frequencies f1 to fn, their amplitudes A1 to An, as well as their phase shifts DEG1 to DEGn can be calculated.

The calculation of the current distribution of the amplitudes A1 to An along the structure and the assessment of its attenuation is used to calculate the potential of the structure with respect to remote earth, hereinafter referred to as "U". The potentials U1 to Un for each of the frequencies f1 to fn is determined by the known longitudinal conductivity of the structure. The combination of the secondary current amplitudes A1 to An leaking from the structure with the respective potentials U1 to Un results in the impedances Z1 to Zn of the structure within the holiday, which is required for a detailed analysis of the processes taking place at the structure/electrolyte interface and the determination of the corrosion protection properties.

The invention increases the resolution in primary and secondary current measurement by several orders of magnitude compared to current attenuation measurements. This high precision eliminates the need for insulation to galvanically separate the structure from earth electrodes. Correspondingly, the ECDA can be applied also in case of direct contact between the structure and earth electrodes, a configuration that is referred to hereinafter as "complex structure". The configuration of complex structures is given in gas compressor stations, nuclear power plants, pumping stations, oil refineries, but also on bridges with stay cables and tendons or depots of DC railway systems. ECDA is particularly relevant in these complex structures that were impossible to analyze in the past not only by ACVG, DCVG, PL as well as CAM but also ILI.

The current generation by the source results in potentials U1 to Un for the various frequencies f1 to fn on the structure. The maximum acceptable value of the potentials U1 to Un for safety of persons is given by the legal requirements with respect to touch potentials, which corresponds to 50 V for a frequency of 50 Hz in Europe for a permanently applied potential U. The level of the potential U controls the resolution of the instrument. A current that is not permanently applied, results in higher acceptable touch potentials. For a current duration of 100 ms, touch potentials of up to 700 V can be acceptable for certain frequencies. Consequently, the current generation of the source can be split into a time of current generation, hereinafter referred to as "tc", and a time without current, hereinafter referred to as "tg". The high time resolution for current generation by the source and field detection by the sensor arrays in the instrument allows for using individual sequences of currents of frequencies f1 to fn of durations tc1 to ten that leaves tgn between the individual current signals. This increases the allowable value of the potentials U1 to Un applied by the source to the structure, and hence the resolution of the instrument. The communication between the source and the instrument further increases the reliability of the measurement and the use of time limited currents, e.g. AC or DC currents, as well as variation of the level of the potentials U1 to Un as needed during the ECDA.

The localizing of the structure and the identification of holidays is performed by the measurement of the field, i.e. the field. Highest precision of the measurement therefore requires precise knowledge of the position of the instrument. This is particularly relevant for airborne measurements. Precise measurement is possible by a positioning system as well as an instrument orientation system and a measurement system to determine the distance between the instrument and the electrolyte surface. This positioning and orientation system can be based on, but is not limited to, light detection and ranging, hereinafter referred to as "LIDAR", a global positioning system, hereinafter referred to as "GPS", radio-location, hereinafter referred to as "RADAR", sound navigation and ranging, hereinafter referred to as "SONAR", an accelerometer and earth magnetic field, or a combination thereof. The combination of the different systems for determining the position of the instrument as well as its orientation and distance to the electrolyte surface is hereinafter referred to as positioning system "PS".

According to an aspect, an improved assessment of the structure in the electrolyte is provided that may comprise detecting holidays in the coating of the structure, thus identifying location with possible corrosion. In an example, a longer part of the structure, e.g. the pipeline or cable, can be monitored. The measurements of the fields are provided to determine the depth of the structure, e.g. within the earth, and the lateral offset to identify holidays in the structure. It is noted that secondary fields arise at defect portions, e.g. corroded parts.

According to an aspect, a primary current is generated within a structure like a pipeline or cable to measure the resulting fields in order to determine if and where current is flowing "out" of the structure. As an example, fields are measured in three spatial orientations. This provides knowledge about the secondary current and hence possible defect portions, which are referred to as holidays.

According to another aspect, the measured fields allow reconstructing resistive properties of the defect portion, i.e.

the holiday, such that the enclosing embedding of that part of the structure can be retrieved. This provides knowledge about the local environment conditions. As an example, whether effective cathodic corrosion protection is provided on the structure.

According to an aspect, to provide reliably assessing the structure in the electrolyte, an electric source is connected between the structure and an earth. A primary current is imposed with at least three frequencies comprising a first frequency of a first duration and of a first amplitude and a second frequency of a second duration and of a second amplitude and a third frequency of a third duration and of a third amplitude. A series of currents with the first frequency, the second frequency and the third frequency are separated by a time gap. A primary field of the frequencies generated by the primary current is measured with an instrument comprising at least a first sensor, a second sensor and a third sensor and a positioning system as follows: A time synchronization between the source with a first communication and an instrument with a second communication is established; a first field is measured for the first frequency for a duration of up to a first duration with the first sensor, the second sensor and the third sensor with a rate of at least four times the first frequency; a second field is measured for the second frequency for a duration of up to the second duration with the first sensor, the second sensor and the third sensor with a rate of at least four times the second frequency; and a third field is measured for the third frequency for a duration of up to the third duration with the first sensor, the second sensor and the third sensor with a rate of at least four times the third frequency; further, at least one physical property for the structure is calculated based on the measured fields.

These and other aspects of the present invention will become apparent from and be elucidated with reference to the embodiments described hereinafter.

BRIEF DESCRIPTION OF THE DRAWINGS

The invention will be better understood from reading the following description, given by way of non-limiting example of a structure, with reference to the attached drawings.

DETAILED DESCRIPTION OF EMBODIMENTS

Figure 1:
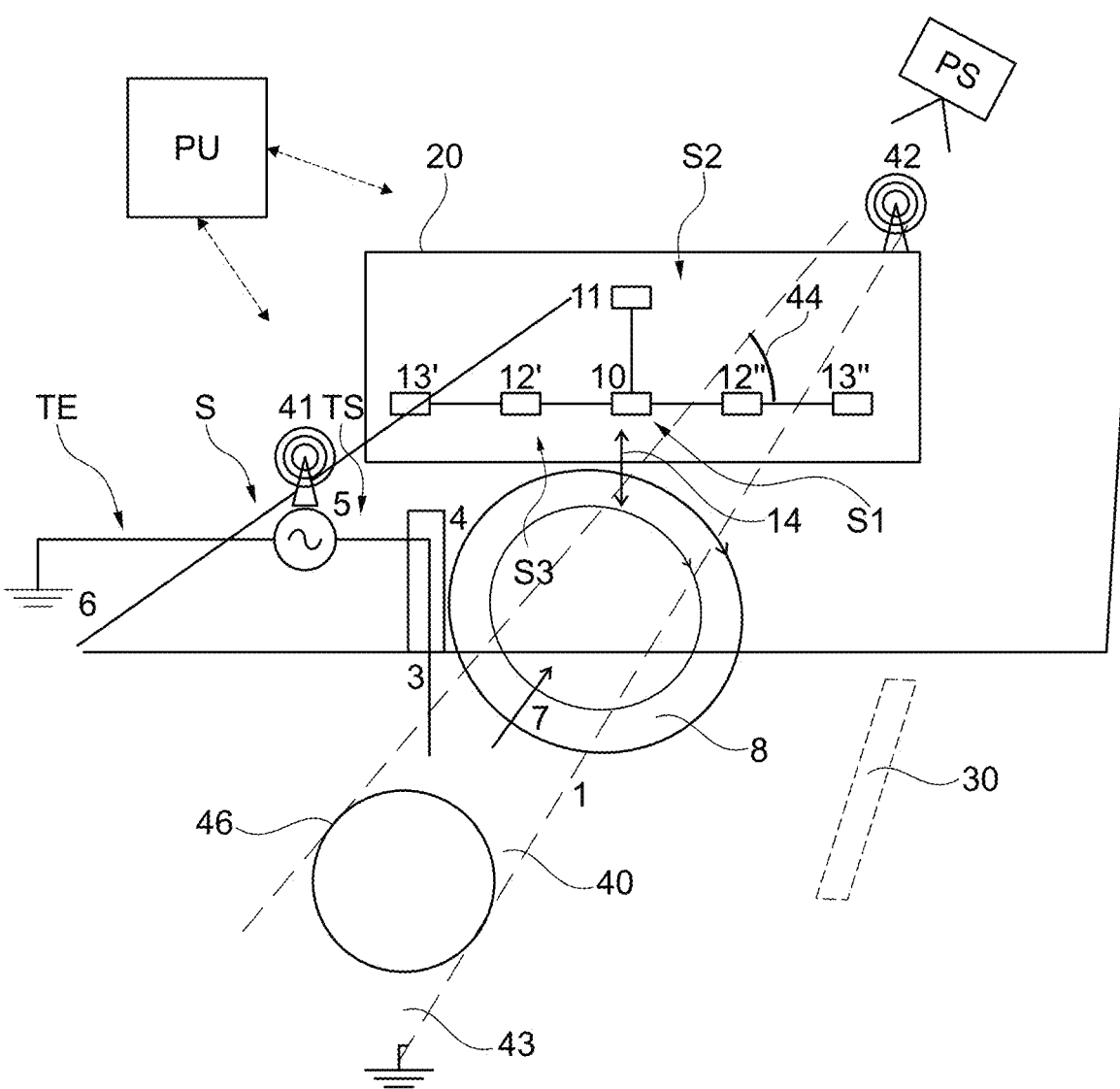
FIG. 1 shows the source as well as the instrument for measuring the amplitudes A1 to An of the current of the frequencies f1 to fn in the structure separated from earth electrodes via an insulation IJ by several sensors that are oriented in parallel for detection of the field associated with the primary current flow in the structure. The arrangement provides information about the location of the structure with a resolution along the length of the structure.

Certain embodiments will now be described in greater details with reference to the accompanying drawings. In the following description, like drawing reference numerals are used for like elements, even in different drawings. The matters defined in the description, such as detailed construction and elements, are provided to assist in a comprehensive understanding of the exemplary embodiments. Also, well-known functions or constructions are not described in detail since they would obscure the embodiments with unnecessary detail. Moreover, expressions such as "at least one of", when preceding a list of elements, modify the entire list of elements and do not modify the individual elements of the list. The present invention relates to a method and a system for assessing the corrosion protection of a metallic structure in contact with an electrolyte. This invention relates to any longitudinally extended metallic structure in contact with any electrolyte. This includes pipelines as well as electrical power or communication cables buried in soil or immersed in water, prestressing tendons installed in concrete, stay cables in condensed humidity as well as rails and tracks installed on gravel, in concrete, in soil or in asphalt. The invention also relates to a method for localizing the metallic structure and localizing defects in the corrosion protection, the thermal or the electrical insulation of the metallic structure. The invention also relates to a method for determining the size of the defects in the corrosion protection, the thermal or electrical insulation, the spread resistance of that defect to the electrolyte, assessing the bedding conditions of the metallic structure within these defects, the size of the defects, the presence of protective layers as well as the corrosion activity of the structure within that defect. The invention relates furthermore to a system for implementing said method.

A metallic structure, hereinafter referred to as "structure", is for technical reasons longitudinally conductive and in contact with an electrolyte. The most relevant examples for a structure are pipelines or cables. These pipelines for the transport of liquid or gaseous media, or cables for the transport of electrical power or communication information, are usually buried in soil or immersed in water. Similarly, the metallic rails and tracks of transportation systems are installed on a gravel bed, in asphalt or in concrete, or a combination of these. Additionally, tendons, anchors or stay cables of bridges are installed in grout, concrete or grease. All these structures have in common that the soil, water, rock, gravel, sand, grout, concrete, condensed humidity etc., hereinafter referred to as "electrolyte", causes contact to the structure and results in a physicochemical reaction with the structure. This physicochemical reaction is referred to hereinafter as "corrosion". For protection against corrosion, structures are usually coated with a corrosion protection system. This corrosion protection can comprise any organic material such as polyethylene, polyurethan, rubber or caoutchouc, epoxy, but also fat, grease or visco-elastic material, polymeric foam etc. is used. Alternatively, an inorganic material such as cement, grout or concrete, metal oxide, passive film or zinc may be applied to or formed on the surface of the structure. These inorganic materials promote the formation or form protective oxide films on the surface of the structure. This externally applied corrosion protection can be a single corrosion protection product or a combination of a number of these. Typical examples are polyethylene and cement, viscoelastic polymers in combination with polyethylene, rubber and cement, grease and polyethylene etc. All these individual or combinations of different corrosion protections applied to the external surface of the structure is hereinafter referred to as "coating". The purpose of the coating is to prevent or limit direct contact between the metal of the structure and the electrolyte. This protection against corrosion based on a coating is usually compromised by the formation of local defects in the coating hereinafter referred to as "holiday". Within this holiday, a direct contact between the electrolyte and the structure is formed, which usually results in a low resistive contact between the structure and the electrolyte and often leads to corrosion of the structure. Corrosion can result in damage to the structure when it sufficiently proceeds including, but not limited to, leakage in the case of pipelines, rupture in the case of tendons and breakage in the case of rails. This holiday in the coating can be formed for various reasons including, but not limited to, mechanical damage of the coating during installation, insufficient application quality of the coating during construction, degradation of the adhesion between the coating and the structure as well as cracking of the coating during operation. For the integrity and safety of structures, it is, therefore, of highest relevance to identify the holidays and classify them with respect to their ability to protect the structure against corrosion.

Since the formation of holidays and therefore corrosion of the structures cannot be excluded, additional measures for ensuring the safe operation of structures are usually required. These methods include, but are not limited to, the application of cathodic protection, the identification and repair of holidays, the inline inspection for identifying metal loss caused by corrosion. The inline inspection is hereinafter referred to as "ILI". While ILI relates to the integrity of structures in the form of pipelines and preventing damages caused by corrosion, a large number of structures are constructed in a way that do not allow for ILI. These structures can only be inspected with respect to the effectiveness of corrosion protection by external corrosion direct assessment hereinafter referred to as "ECDA". The methods used for ECDA are usually based on the connection of an external electrical current source, hereinafter referred to as "source", based on direct current (DC) or alternative current (AC) between the structure and earth, including but not limited to an earthing system an anode bed or a temporary installation of interconnected earth rods, hereinafter referred to as "earth". This AC and/or DC current is referred to hereinafter as "current". This source results in a current flow along the structure and current leakage into the electrolyte at the holidays. For ECDA, is it necessary to localize the position of the structure with high precision. This position of the structure is usually determined by so called cable or pipe locators, hereinafter also referred to as "PL". This method is based on measuring the primary field perpendicular to the structure generated by a primary current with a first frequency f1, referred hereinafter to as "field" generated by the current injected by the source onto the structure. The frequency generated by the source is hereinafter referred to as first frequency f1. The first frequency f1 can correspond to DC (0 to 10 Hz) or AC (10 to 100'000 Hz). Additional frequencies are hereinafter referred to as second frequency f2, third frequency f3 up to nth frequency fn. In case of the PL, one electromagnetic field sensor, hereinafter referred to as "sensor" is used. An effective determination of the position of the structure is facilitated when the structure is separated by an electrical insulation from metallic structures with low resistance to the electrolyte. This electrical insulation comprises insulation joints in the case of pipelines and rails or insulating material between tendons and rebars. The insulation is referred to hereinafter as "IJ". The electrodes are usually earthing systems comprising reinforcing steel in concrete or copper, stainless steel or galvanized steel ribbons and/or bars in the electrolyte. These earthing systems are hereinafter referred to as "earth electrodes".

The current of the first frequency f1 imposed by the source flows along the structure that is separated from electrodes by at least one insulation IJ. Measurement of the field allows for detection of the position of the structure in the electrolyte. A part of the current, referred to as secondary current, leaks from the structure through the holidays in the coating into the electrolyte. This current leakage is associated with a voltage gradient (VG) in the electrolyte. The voltage gradient can readily be detected by measuring the voltage between two reference electrodes placed on the electrolyte above or next to the structure. These electrodes can comprise metal rods, but Cu/CuSO4 as well as Ag/AgCl half cells can be used for this purpose. Depending on the first frequency f1 of the source (alternating of direct current), the method is referred to as DCVG or ACVG. By DCVG or ACVG it is possible to identify the holidays and, therefore, the position of defects in the coating and hence damages in the corrosion protection of the structure are identified. Besides the localizing of the position of the structure, the knowledge of the position of the holidays is crucial for ECDA, since corrosion is usually associated with these holidays in the coating. However, these methods based on voltage gradients have drawbacks. One is the need for contact between the electrodes and the electrolyte. Furthermore, buried metallic components, such as third-party infrastructure, including but not limited to pipelines, reinforced concrete, earth ribbons etc., may affect the voltage gradient measured and may lead to erroneous results. In typical urban environment with asphalted surfaces and relevant quantity of buried metallic components, performing these measurements requires interpreting the data. Additionally, the increasingly dry conditions during summer make VG measurements difficult. The necessity of low resistive contact of the reference electrodes to the electrolyte is overcome by the method called current attenuation measurements, hereinafter also referred to as "CAM". This method is based on a PL that has a second added sensor. The concurrent measurement of the field with the two sensors positioned perpendicular to the structure within the PL allows for calculating the distance between the PL and the structure as well as the primary current in the structure. This is due to the fact that the field is proportional to the current in the structure as well as the distance between structure and the sensors. The CAM comprising a PL with two sensors, therefore, allows to assess the current distribution along the structure. Holidays can be identified by a decrease of the current along the structure due to the current leakage at the holiday. The resolution of the method is mainly affected by the resolution limitations of the CAM and the amount of current leakage from the structure through the holiday into the electrolyte. Large currents leaking can readily be identified with a CAM. However, smallest holidays with minimal current leakage may not be detected. Furthermore, CAM may be affected by metallic components in the vicinity of the structure that may disturb the field and prevents the detection of smallest holidays with small current leakage. Correspondingly, CAM resolves the issues with paved or very dry surfaces but can only be applied to largest holidays.

FIG. 1 shows an example of a system for assessing a structure arranged in an electrolyte is provided. The system comprises a source S with an electric output terminal TS configured for connection to the structure, an electric output terminal TE configured for connection to earth. The source S is configured to provide a current with at least three frequencies at least within the structure. The system further comprises an instrument I with at least a first sensor S1, a second sensor S2 and a third sensor S3 in a known spatial relation. Each sensor is configured to measure a field of an electric field along the structure for each of the at least three frequencies. As an option, the three sensors are replaced by sensor arrays that provide the measurement of the field in all three spatial orientations. The system also comprises a positioning and orientation system PS configured to provide position data of the instrument. The system also comprises a processing unit PU in data communication with the source and the instrument (as indicated with double arrows in broken lines). The processing unit is configured to compute at least one primary field resulting from an electric current within the structure based on the measured field.

It is noted that the so-to-speak basic system as described above is shown in the drawings also in the context of further optional features and aspects, which are provided in more detail below.

Referring to the drawings (e.g. see FIG. 1), one sees a structure 1 with a coating 40 separated by an insulation 46 from an earth electrode 43 immersed in an electrolyte 2 with a cable 3 connected that is extracted into a test post 4.

A source 5 equipped with a first communication 41 is connected to the cable 3 in the test post 4 and to an earth 6. This source 5 is time synchronized via the first communication 41 and is generating a sequence of primary currents 7 of frequencies f1 to fn with amplitudes A1 to An of durations tc1 to tcn with a frequency ranging from 0 to 100'000 Hz and time gaps tg1 to tgn-1 between the individual frequencies ranging from 0 to 10 seconds as well as a time gap of tgn ranging from 0 to 10 seconds between each sequence of the frequencies f1 to fn of the currents 7. The currents of the different frequencies f1 to fn are often generated by the source in series, but it is also possible that individual frequencies are overlapping. This overlap is particularly useful for a frequency f0 of 0 Hz that corresponds to a current CP of an amplitude A0 and that is imposed permanently by the source 5 onto the structure 1. These primary currents 7 are flowing along the structure 1 generating a concentric primary field 8 (see FIG. 1 and FIG. 2) of the frequencies f1 to fn around the structure 1.

The concentric field 8 is perpendicular to the current and hence to the structure 1. A first sensor 10 oriented at an angle 44 to the structure will detect the primary field 8 at the position of the first sensor. Usually, the angle 44 is chosen to be 90°. This sensor 10 is installed in an instrument 20. The instrument 20 is time synchronized with the source 5 by the second communication 42. This exchange of data for synchronization can be between 41 and 42 directly or via an additional network that provides a time stamp, such as but not limited to a server, a relais or a GPS satellite. Alternatively, the instrument 20 and the source 5 may be equipped with an atomic clock that is synchronized via the first and second communication 42 and 41. The instrument 20 is furthermore equipped with a PS that determines the position of the instrument 20, its orientation as well as its distance to the surface of the electrolyte 2. By using a second sensor 11 oriented vertically above and parallel to the first sensor 10, the field 8 is measured concurrently at two positions in space. The difference in the magnitude of the field 8 detected by the first sensor and second sensor 11 allows for calculating the distance 14 of the structure 1 from the sensor 10 and the amplitude A1 to An of the primary current 7. This measurement based on the first sensor 10 and the second sensor 11 only provides reliable data for depth 14, when the field 8 is circular and concentric around the structure 1.

A metallic component 30 above or in the electrolyte 2 distorts the homogeneity of the field 8. This results in miscalculations of the depth 14 and the amplitude A1 to An of the current 7 from the field 8. By installing the third sensor 12' and the fourth sensor 12" lateral and parallel to the first sensor 10, the distortion of the field can be determined and corrected. This results in increased precision of the calculated depth 14 and the calculated amplitude A1 to An of current 7. The further increase of the number of lateral and parallel sensors by adding the fifth sensor 13' and the sixth sensor 13" will result in additionally increased precision of the calculation of the depth 14 and the amplitudes A1 to An of the current 7.

The high precision of determining the field 8 around the structure 1 with at least three sensors 10, 12 and 12' allows for determining the distance 14 between the sensor 10 and the structure 1. Additionally, the lateral position of the structure 1 in the electrolyte 2 relative to the sensors 10, 12 and 12' is determined. The precision of this measurement is improved with an increasing number of lateral sensors 13 and 13'. The combination of the instrument 20 with a positioning system 45 that provides information with respect to position of the instrument 20 in the three spatial coordinates, with respect to its orientation in all three spatial angles and with respect to the distance to the electrolyte surface, detailed information on the position of structure 1 is obtained. By following the structure 1 with the instrument 20 and taking measurements of the field 8 and the position with the positioning system 45 at least every meter, a trajectory of the structure 1 is determined. This information is crucial for ECDA. But it provides further information with respect to the integrity of the structure 1. Comparing the trajectory of the structure 1 with the data determined during installation of structure 1 allows for the detection of the movement and deformation of the structure 1 in the electrolyte 2. This movement can be the result of landslides, electrolyte 2 instability and electrolyte 2 settlement, but also deformation during construction and operation of the structure 1 in the electrolyte 2. The assessment of a trajectory that deviates from the original location of installation of the structure 1 allows for the calculation of elastic and plastic deformation of the structure 1 and the associated mechanical stress. This information and the repeated assessment of the position of the structure 1 and the associated mechanical stress on the structure 1 over time provides crucial information. This information is required for the integrity assessment of the structure 1 under difficult geological situations in a critical electrolyte 2.

Figure 2:
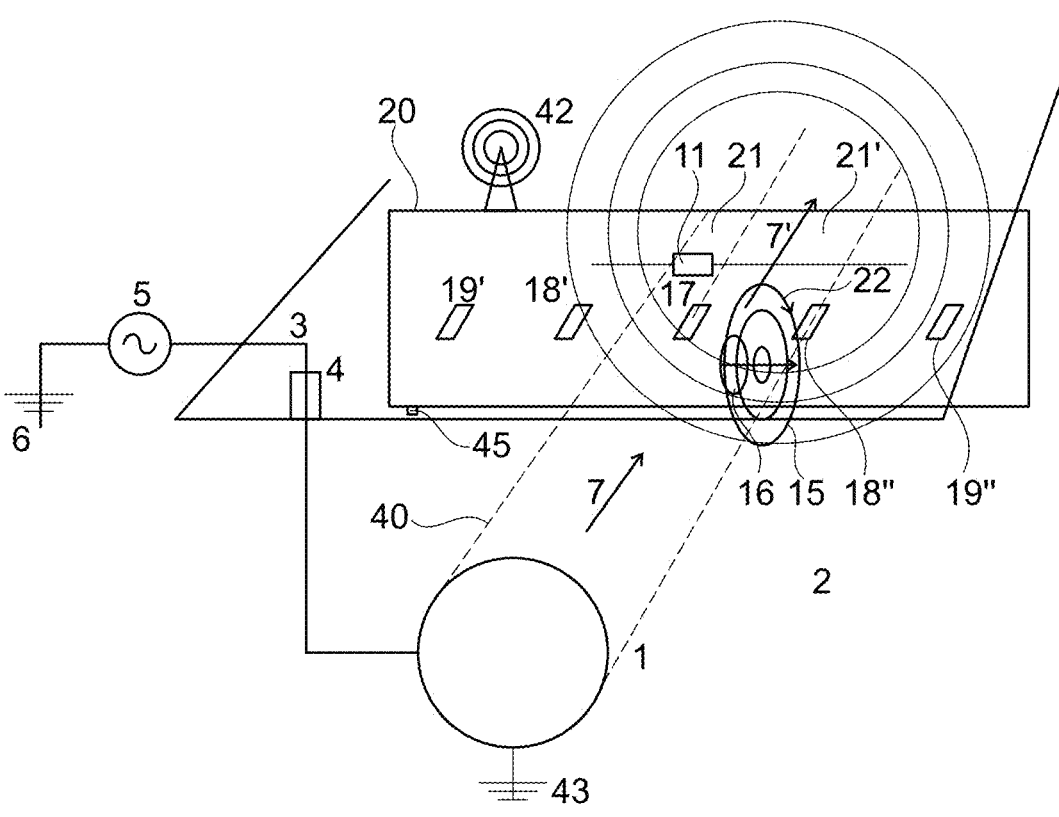
FIG. 2 shows the instrument above the complex structure without insulation IJ with a holiday in the coating, resulting in current leakage into the electrolyte, as well as the field associated with the secondary current flow from the structure into the electrolyte. The arrangement provides information about the detection of a holiday on the structure.

The assessment of the amplitudes A1 to An of the primary current 7 with highest precision can be used for identifying a holiday 16 in the coating 40 on the structure 1 without insulation 46 representing a complex structure (FIG. 2). A fraction of the primary current will leak as secondary current 15 from the structure 1 into the electrolyte 2 at the holiday 16 in the coating 40. Correspondingly, the amplitudes A1 to An of the primary current 7 between the source 5 and the holiday 16 are higher than the amplitudes A1 to An of the primary current 7' after the holiday. The following relation applies:

$$An\ 7=An\ 7'+An\ 15$$

A high precision in determining the field 8 around the structure 1 results in a high precision in the assessment of the amplitudes A1 to An of the primary current 7 and the amplitudes A1 to An of the current 7'. Correspondingly, the detection of a holiday 16 with small size can be achieved even in case of a complex structure without insulation and direct contact to an earth electrode 43.

In an example, the three spatial orientations are detected with sensor arrays comprising three sensors each in all three spatial orientations. As an option, all sensors in FIG. 1 are replaced by sensor arrays. As another option, all sensors in FIG. 2 are replaced by sensor arrays.

In an example, a field of the secondary current is perpendicular to the pipeline and is measured with a sensor arrangement parallel to the pipeline. For example, a combination of three individual sensors in a sensor array is provided to determine the field in all three spatial orientations.

The secondary current 15 leaking through the holiday 16 from the structure 1 into the electrolyte 2 will generate a secondary field 22 that is not parallel to the primary field 8. The resolution of the instrument 20 in detecting holidays 16 is further increased by adding a seventh sensor 17 to the instrument 20 that is oriented at an angle 21 to the sensor 10. This seventh sensor 17 will allow for detecting the contribution of the secondary field 22. The angle 21 is often 90°. In presence of a holiday 16, the secondary field 22 is detected. The demonstration of the presence of the secondary field 22 is, therefore, the demonstration of the presence of the holiday 16. The sensitivity of the instrument 20 is further increased by the installation of an additional eighth sensor 18' and a nineth sensor 18" that are at an angle 21' to the orientation of the first sensor 10. Usually, the angle 21' is 90°. The secondary field 22 determined in the seventh sensor 17, the eighth sensor 18' and the nineth sensor 18" is used to calculate the position of the holiday 16 on the circumference of the structure 1. The additional installation of a tenth sensor 19' and an eleventh sensor 19" will allow for compensation of a possible distortion of the secondary field 22, and additionally increases the resolution of determining the amplitudes A1 to An of the secondary current 15.

Figure 3:
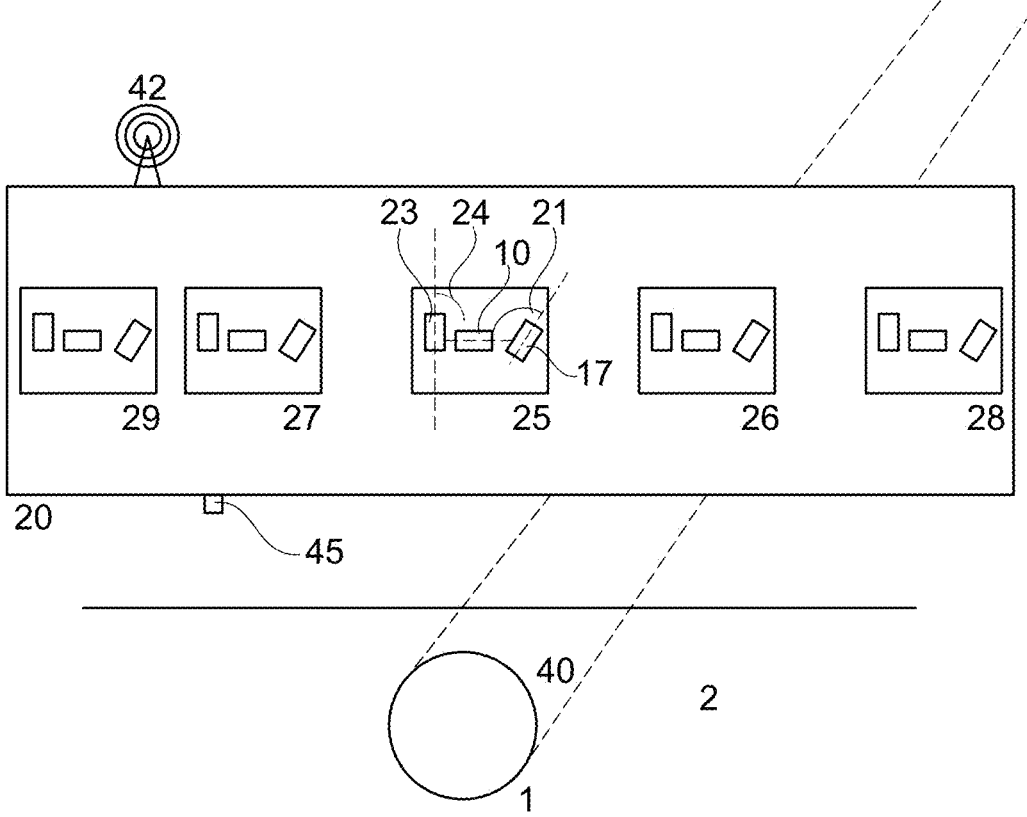
FIG. 3 shows the instrument comprising sensor-arrays that allow for measurement of the field in all three spatial coordinates. The arrangement provides information about the spatial extension.

The resolution of the method is further increased by adding to the sensor 10 that is oriented at an angle 44 to the structure and the sensor 17 that is oriented at the angle 21, an additional twelfth sensor 23 (FIG. 3). This twelfth sensor 23 is oriented at an angle 24 to the plane described by the orientation of the first sensor 10 and the seventh sensor 17. Usually, the angle 24 is chosen to be 90°. In this configuration, the primary field 8 can be detected in all three spatial coordinates and the vectorial component of the secondary field 22 is assessed with respect to its vectorial components. In an option, the first sensor 10, the seventh sensor 17 and the twelfth sensor 23 are combined into a first sensor-array 25. This allows for simplifying the configuration in the instrument 20. The angle 21 and the angle 24 are usually chosen as 90° on the first sensor array 25. By combining at least the first sensor-array 25 with a second sensor-array 26 and a third sensor-array 27, an effective construction of the instrument 20 is achieved. Adding additional sensor arrays will further increase the resolution of the instrument, e.g. by adding a fourth sensor array 28 and a fifth sensor array 29.

Further increasing the number of sensor arrays will increase the precision of the measured primary field 8 and the secondary field 22. This provides highest resolution for the amplitudes A1 to An of the primary current 7 and the secondary current 15.

The identification of the holiday 16 is performed by following the structure 1 with the instrument 20 and taking readings of the primary field 8 and the secondary field 22 of at least the first sensor-array 25, the second sensor-array 26 and the third sensor-array 27 at least every 1 m along the structure at a data acquisition rate of at least 10 kHz. While values smaller than 1 m are required for maximum resolution, the identification of the holiday may initially be based on measurements at the beginning and the end of the structure 1 or at any intermediate position such as at each test post 4. Ideally, the readings are taken at least every cm (centimeter) along the structure on the at least three sensor arrays 25, 26 and 27 at a data acquisition rate of at least 10 kHz. Based on the totality of these data, the reliable identification of the holiday 16 in the coating 50 on the structure 1 is achieved.

Figure 4:
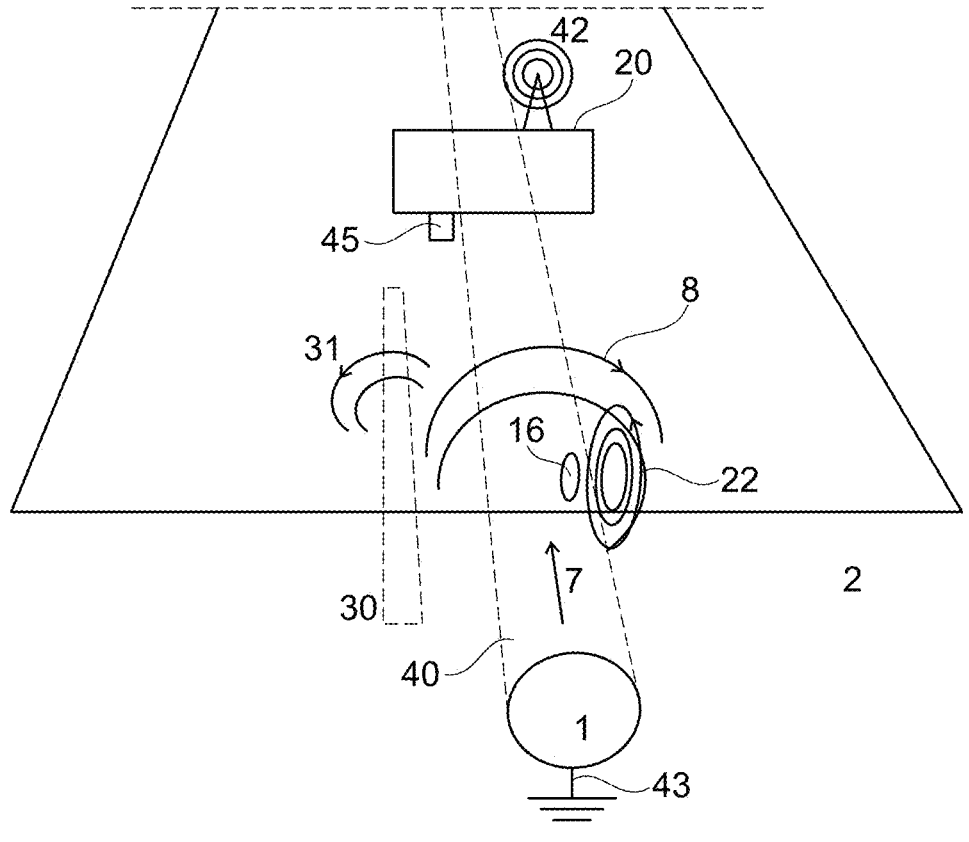
FIG. 4 shows the field distribution around the complex structure without insulation, as well as the instrument comprising sensor-arrays that allow for measurement of the field in all three spatial coordinates.

A metallic component 30 in the electrolyte 2 in the proximity of the structure 1 can distort the primary field 8 (FIG. 4) by an induced field 31. The induced field 31 is characterized by a phase shift compared to the primary field 8 and the primary currents 7. The high time resolution of the data acquisition and data processing of the instrument 20 allows for measurement of the phase shifts DEG1 to DEGn between the primary currents 7, the primary field 8, the secondary field 22 and the induced field 31. The determination of the phase shift DEG allows for differentiation between the contributions of the metallic component 30 and the holiday 16.

Figure 5:
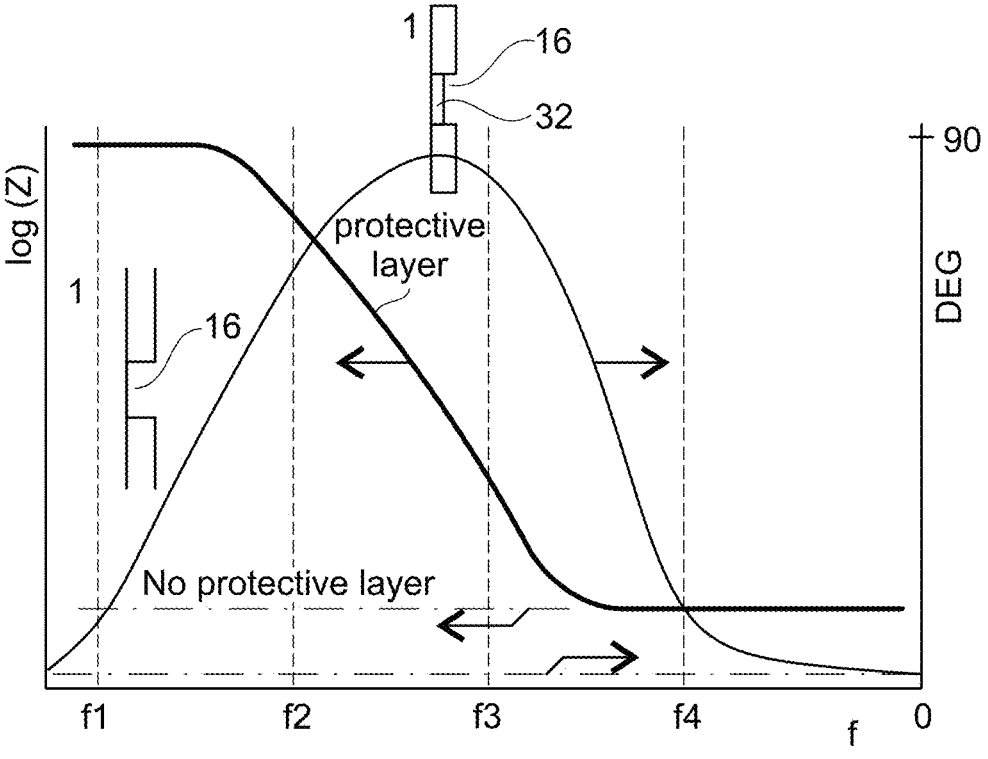
FIG. 5 shows the continuous frequency dependency of the impedance Z and the phase shift DEG for a holiday with a protective layer, as well as a holiday without a protective layer. Additionally, the values detected by the instrument at frequencies f1, f2, f3 and f4 are shown by dashed lines.
Figure 7:
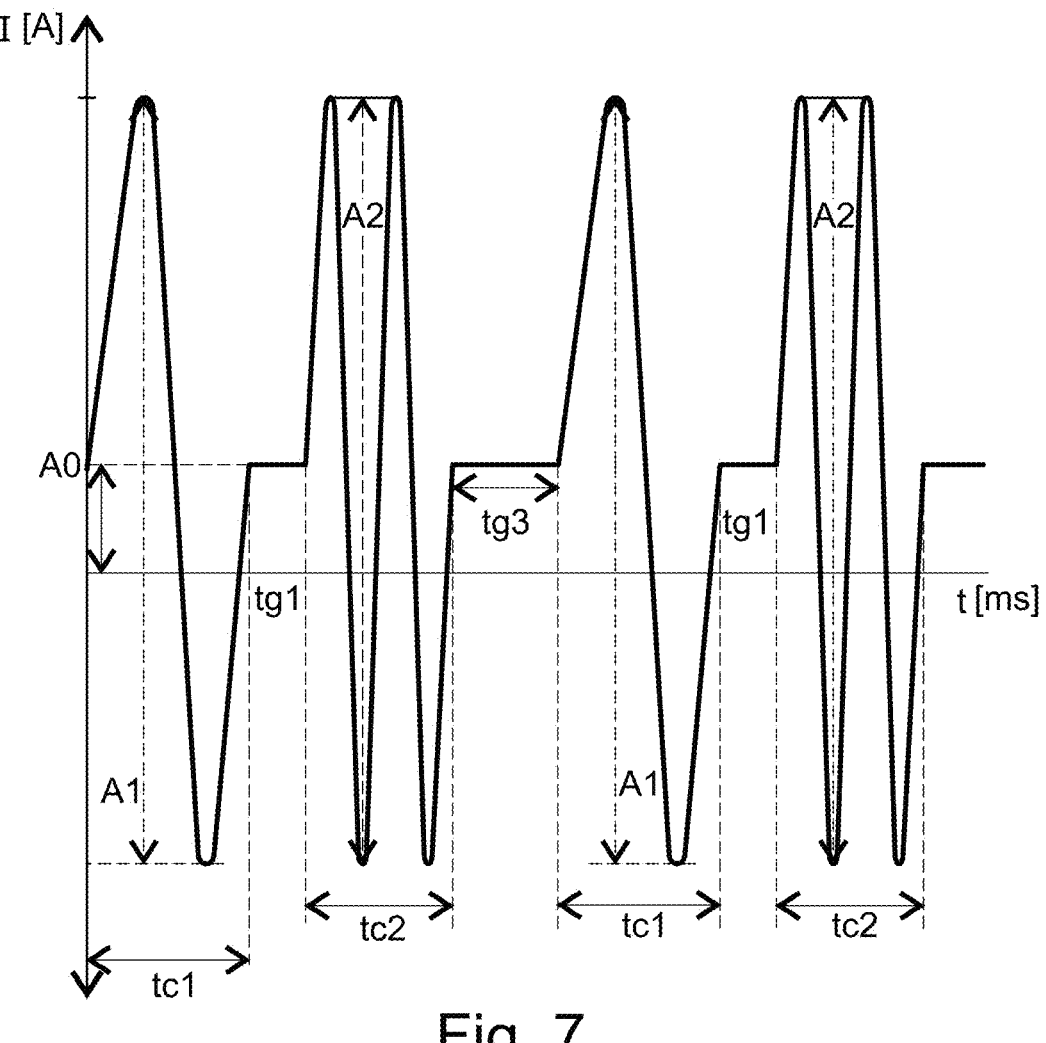
FIG. 7 shows the time resolved application of the current by the source to the structure.

The detection of the holiday is crucial from the point of view of structure integrity assessment. However, with respect to the assessment of ECDA and the integrity of the structure, the analysis of the different frequencies f1 to fn as well as the amplitudes A1 to An of the current 15 is required. The instrument 20 comprises at least the first sensor-array 25 with the second sensor-array 26 and the third sensor-array 27 allows for assessing the amplitudes A1 to An of the primary current 7 in the structure 1 as well as the amplitudes A1 to An of the secondary current 15 leaking from the structure 1 through the holiday 16 into the electrolyte 2. With known longitudinal resistivity of the structure 1, the amplitudes A1 to An of the current 7 allows to calculate an ohmic drop along the structure 1 from the source 5 to the holiday 16. Therefore, the potentials U1 to Un at the holiday 16 are known for each frequency f1 to fn. Combining the potentials U1 to Un with the amplitudes A1 to An of the current 15 allows for calculating the impedance Z1 to Zn for each frequency. Based on the calculated frequency dependence of the impedance Z1 to Zn and the phase shift DEG1 to DEGn, it is possible to conclude on a formation of a protective layer 32 on the structure 1 within the holiday 16. In certain cases, an increase of the impedances Z1 to Zn with decreasing frequency, indicates the presence of a protective film within the holiday 16. Often this frequency dependence is associated with a change of the phase angle. In contrast, in absence of a protective layer, there is no or only a small frequency dependence of the impedances Z1 to Zn and the phase angles, i.e. the phase shifts DEG1 to DEGn. These effects are illustrated in FIG. 5 for the case of formation and absence of a protective layer. For this analysis, the source 5 has to generate at least two different frequencies f1 and f2 that can be in the range of 0.001 to 100'000 Hz, but are mostly in the range of 10 to 10'000 Hz. The precision of this analysis increases with an increasing number of frequencies n generated by the source 5. Usually, at least four frequencies (f1, f2, f3 and f4) are sequentially applied by the source 5 between the structure 1 and the earth 6 (FIG. 7). These frequencies can be generated sequentially in time generating a sequence of primary currents 7 as follows: f1=11 Hz with A1=1A for tc1=1 second, followed by a gap tg1=0,1 s, f2=111 Hz with A2=1,5 A for tc2=0.1 second, followed by a gap tg2=0,2 s, f3=1111 Hz with A3=3 A for tc3=0,01 second, followed by a gap tg3=0,3 s. The next series of the primary current 7 with frequencies f1 to fn can be applied by the source 5 with a delay of tg3=0,3 seconds. Adjusting the time gap tg3=0 seconds will result in an immediate beginning of the next sequence. The signal application based on a sequence of discrete frequencies is hereinafter referred to as "series". Furthermore f1, f2 or f3 can be applied by the source 5 concurrently in individual bursts of the duration tc1 separated by time gap tg1 or permanently (tc1=∞ and tg1=0). The application of an amplitude A0 with infinite duration is particularly relevant for frequency f0=0 Hz. This corresponds to a direct current associated with cathodic protection applied by the source 5. Instead of applying discrete frequencies, a Compressed High-Intensity Radiated Pulse, hereinafter referred to as "CHIRP" can be used that is based on broadband frequency range. It represents a continuous range of frequencies rather than discrete frequencies f1 to fn and may be considered as a large number of sequential frequencies with n typically being larger than 10. Another option is the use of individual pulses as combinations of various frequencies that are applied overlapping, hereinafter referred to as "pulse". The combination of frequencies imposed by the source 5 between the structure 1 and the earth 6 based on a series, CHIRP or pulse as well as a combination thereof applied continuously or with a value of tc and/or interrupted by tg or any combination of these, is hereinafter referred to as "signal".

Corrosion protection of the structure 1 within the holiday 16 is affected by blocked convection in the adjacent electrolyte 2 on the surface of the structure 1. Convection blockage is achieved for example by good bedding of the holiday 16 in fine sand or soil. With respect to ECDA it is, therefore, relevant to determine the presence of good bedding at the surface of the structure 1 in contact with the electrolyte 2 within the holiday 16. This is possible by changing the amplitude A0 of the frequency f0=0 Hz, hereinafter referred to as A0, of the structure 1 with respect to the electrolyte. The presence of good bedding is Determined by the following procedure:

Determining the impedances Z1 to Zn at A0.

Changing the amplitude A0 to amplitude A0' by the source 5. Thereby, the negative output of the source 5 is connected to the structure 2 and the positive output of the source 5 is connected to the earth 6.

Figure 6:
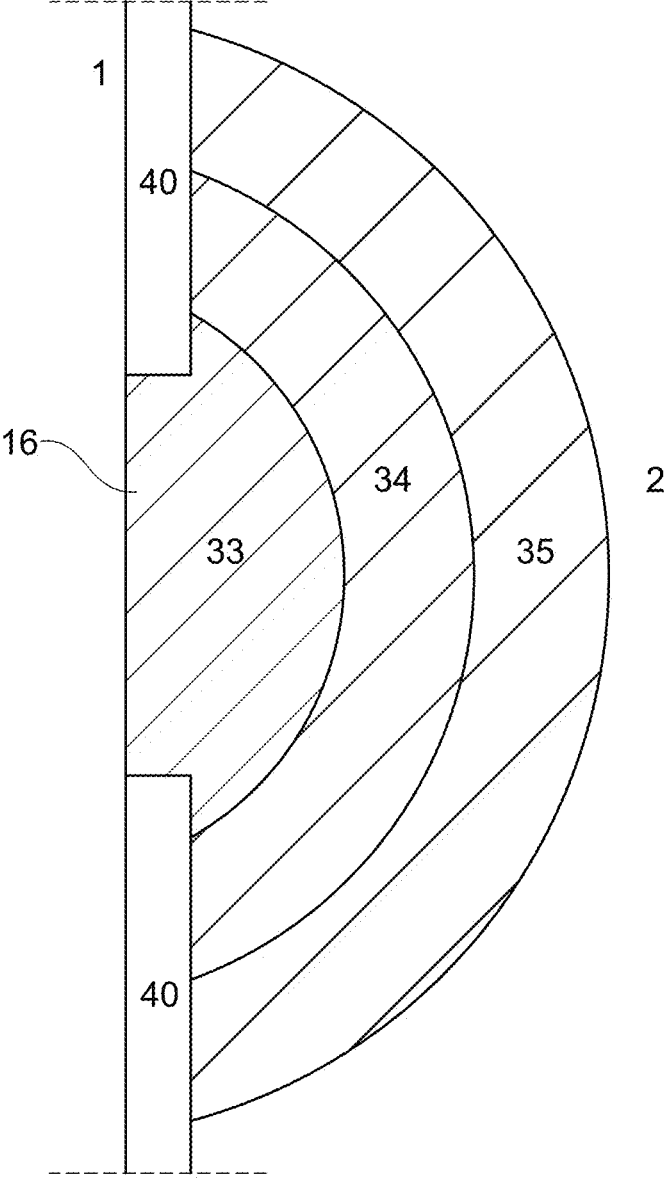
FIG. 6 shows the accumulation of hydroxide ions at the surface of the structure within a holiday as a result of the application of a current CP, between the structure and the electrolyte.

Determining the impedances Z1 to Zn while or after the application of A0'. A decrease of the impedances Z1 to Zn is characteristic for the accumulation of hydroxide ions at the structure 1 within the holiday 16. In FIG. 6, the high concentration of hydroxide ions on the structure 1 in holiday 16 is shown with a first zone 33 (high pH). In the adjacent second zone 34 (lower pH), the concentration of hydroxide ions is lower. In the more distant third zone 35 (even lower pH), the concentration of hydroxide ions is even lower to reach the concentration of hydroxide in the bulk electrolyte 2. The concentration distribution of hydroxide ions (and hence pH) in the electrolyte 2 is shown in FIG. 6 by distinct areas for illustration purposes. In reality, it is mostly a continuous decrease from a high concentration of hydroxide ions (high pH) at the surface of the structure 1 in holiday 16 to the bulk of the electrolyte 2. It is characteristic that the generation of these hydroxide ions increases the total ion concentration and, therefore, decreases the impedances Z1 to Zn as a result of the change from the amplitude A0 to the amplitude A0'. Based on this procedure, the good bedding and, therefore, the presence of conditions permitting the accumulation of hydroxide ions is demonstrated. This is the precondition for effective corrosion protection by cathodic protection. The presence of this important precondition is demonstrated by this method.

Both, the demonstration of convection blocking properties and the associated accumulation of hydroxide ions required for corrosion protection as well as the demonstration of the presence of protective layers within the holiday, are indirect demonstrations of effective corrosion protection determined by the invention. Additionally, it is possible to demonstrate the presence of protective layers, which is the result of an increased concentration of hydroxide ions as shown in FIG. 6. This effect is based on the fact that the interface between the structure 1 and the electrolyte 2 acts from the electrical point of view as a diode. The currents 15 passing through this interface generate a DC current. This DC current can be assessed based on the following procedure:

The source 5 is connected to the structure 1 and the earth 6, and generates the primary current 7 with an amplitude A1 to An.

The secondary field 22 caused by the current 15 leaking through the holidays 16 into the electrolyte 2 are assessed with the instrument 20 with a data acquisition rate of at least 1000 Hz corresponding to a time resolution of at least 1 ms. For each of the frequencies f1 to fn, the average value of the current 15 over one or multiple AC cycles is calculated. This provides apparent DC currents ADC1 to ADCn at the amplitudes A1 to An.

The source 5 is modified to generate the current 7 with the amplitudes A1' to An'. The amplitudes A1' to An' are either larger or smaller than the amplitudes A1 to An.

The secondary field 22 caused by the secondary currents 15 leaking through the holiday 16 into the electrolyte 2 is assessed with the instrument 20 with a data acquisition rate of at least 1000 Hz corresponding to a time resolution of at least 1 ms. For each of the frequencies f1 to fn, the average value of the current 15 over one or multiple AC cycles is calculated. This provides apparent DC currents ADC1' to ADCn' at the amplitudes A1' to An'.

The following conclusion is possible based on the evaluated data assuming the amplitudes A1' to An' are larger than the amplitudes A1 to An, and that a more negative value of the apparent DC currents ADC1 to ADCn indicates a technical current passing from the structure 1 into the electrolyte 2 for the first frequency f1 being in the order of magnitude of 30 Hz:

a) If the first apparent DC current ADC1' is larger than the first apparent DC current ADC1, the structure 1 within the holiday 16 is covered with a protective layer 32 and the corrosion protection is effective.

b) If the first apparent DC current ADC1' is smaller than the first apparent DC current ADC1, the structure 1 within the holiday 16 is corroding and the corrosion protection is not effective.

c) If the first apparent DC current ADC1' is equal to the first apparent DC current ADC1, the change in the amplitude between the amplitude A1 and the amplitude A1' is too small for a conclusive analysis.

The assessment of the contribution of the current 7 to the first apparent DC current ADC1 is possible due to the fact that the change from the amplitude A1 to the amplitude A1' and back to the amplitude A1 occurs within a short time tgn of less than 10 seconds and ideally less than 1 second. Due to the short time interval tgn, the contribution of other disturbing effects is excluded. Correspondingly, the absolute values of the first apparent DC current ADC1 and the first apparent DC current ADC1' are irrelevant since the assessment of the corrosion protection is based on the relative change of the value of the apparent DC current ADC to ADC'. The assessment is correspondingly based on the difference ADC-ADC'. This procedure allows for a direct assessment of the presence of protective layers 32 within the holiday 16. Correspondingly, the invention allows for performing an ECDA that goes significantly further than the localizing of the structure 1 and the identification of an individual holiday 16. In case the measurement does not provide a conclusive analysis (case c), the second communication 42 of the instrument 20 with the first communication 41 of the source allows for an application of a first amplitude A1" that is larger than the first amplitude A1'. If the application of the first amplitude A1" causes the first potential U1 to exceed the acceptable touch potential limit on the structure 1, the first duration tc1 is accordingly decreased and the first time gap tg1 is increased. This information exchange and adaptation of the parameters between the instrument 20 and the source 5 is referred to hereinafter as "optimization". The combination of communication between the instrument 20 with the source 5 and the time synchronized adaptation of the frequency f, the amplitude A, the duration tc and the time gap tg allows for further increasing the resolution of the instrument.

For the integrity assessment of the structure 1, it is not only relevant to know the impedances Z1 to Zn of the holiday 16 as well as the presence of protective layers on the structure 1 within the holiday 16. While the determination of the bedding conditions of the holiday 16 as well as the demonstration of the presence of protective layers 32 is relevant with respect to the integrity assessment of the structure 1, it does not allow for assessing the current density within the holiday 16. The invention allows for determining the key parameters of the system like the localizing of the structure 1, position of the holiday 16 along the structure 1 and the impedances Z1 to Zn for the passage current 15 from the structure 1 into the electrolyte 2. However, a full assessment additionally requires the surface S of the holiday 16 that is in contact with the electrolyte 2.

A first estimation of the surface SH of the holiday 16 is possible based on the fourth impedance ZA determined for the fourth frequency f4 in FIG. 5, which is in the order of magnitude of 1 kHz in combination with the resistivity rho of the electrolyte 2. The surface SH is directly calculated by the following equation:

$$SH=(rho/(4*Z4))2*\pi$$

This equation assumes homogeneous soil conditions and excludes the generation of hydroxide ions in the holiday 16 as well as their diffusion and migration into the adjacent electrolyte. It is hence assumed that the pH of the first zone 33, the second zone 34 and the third zone 35 corresponds to the pH of the electrolyte 2. Correspondingly, the surface of the holiday is usually overestimated by this approach. The analysis can be significantly improved based on the measurement difference between the first apparent DC current ADC1 and the first apparent DC current ADC1' obtained for the first amplitudes A1 and A1'. By optimization, the maximum level of the first amplitude A1" can be significantly increased without resulting in dangerous touch potentials for the first potential U1" on the structure 1.

$$U_1=Z_1 \cdot SH \cdot (ADC_1 \cdot Z_1 \cdot S - E + U_0)/k$$

The potential $U_0$, the frequency f and the surface SH are independent on the change from the amplitude A1 to the amplitude A1'. Furthermore, it can be assumed that the change in hydroxide concentration is small from the amplitude A1 to the amplitude A1' and the impedance Z1, k as well as E can therefore be considered constant, it is possible to calculate the surface SH. When the surface SH and the impedances Z1 to Zn are known, it is immediately possible to calculate the AC and DC current density of the holiday 16 for various interference conditions. Therefore, the usually available monitoring data of structures 1 can be used to determine the compliance of the holiday 16 with the current densities specified in the relevant standards.

Figure 8:
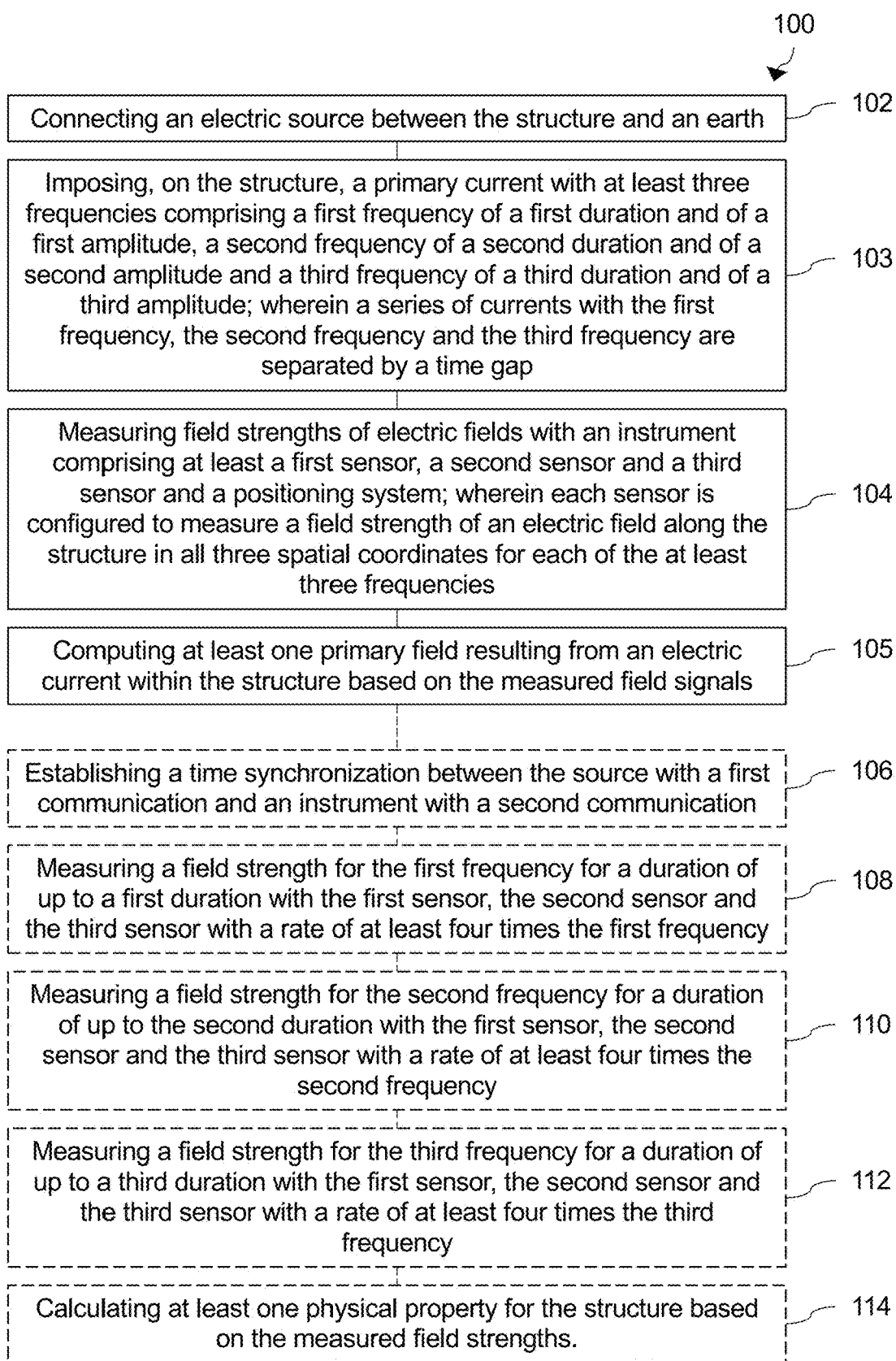
FIG. 8 shows basic steps of an example of a method for assessing a structure arranged in an electrolyte.

FIG. 8 shows basic steps of an example of a method 100 for assessing a structure arranged in an electrolyte. The method 100 comprising the steps:

Connecting 102 an electric source between the structure and an earth;

Imposing 103, on the structure, a primary current with at least three frequencies comprising a first frequency of a first duration and of a first amplitude, a second frequency of a second duration and of a second amplitude and a third frequency of a third duration and of a third amplitude; a series of currents with the first frequency, the second frequency and the third frequency are separated by a time gap;

Measuring 104 field with an instrument comprising at least a first sensor, a second sensor and a third sensor and a positioning system; each sensor is configured to measure a field along the structure for each of the at least three frequencies; in an option the sensors are replaced by sensor arrays; and Computing 105 at least one primary field resulting from an electric current within the structure based on the measured field.

In an option of the method, not shown in detail, it is further provided:

Locating the structure by detecting a primary field generated by a primary current of the first frequency, the second frequency and the third frequency within the structure.

In an option of the method, not shown in detail, it is further provided:

Identifying a holiday by detecting a secondary field generated by a secondary current of the first frequency, the second frequency and the third frequency. For example, this provided by a sensor that is at an angle 21 relative to the first sensor.

In an option of the method, shown as an option in FIG. 8 with broken lines, for measuring it is further provided:

Establishing 106 a time synchronization between the source with a first communication and an instrument with a second communication;

Measuring 108 a field for the first frequency for a duration of up to a first duration with the first sensor, the third sensor and the fourth sensor with a rate of at least four times the first frequency; and Measuring 110 a field for the second frequency for a duration of up to the second duration with the first sensor, the third sensor and the fourth sensor with a rate of at least four times the second frequency; and Measuring 112 a field for the third frequency for a duration of up to a third duration with the first sensor, the third sensor and the fourth sensor with a rate of at least four times the third frequency; and Calculating 114 at least one physical property for the structure based on the measured fields.

In an option of the method, not shown in detail, it is further provided:

Measuring of a first phase shift and a second phase shift and a third phase shift of the at least three frequencies imposed by the source and the measured field by the first sensor, the third sensor and the fourth sensor generated by the primary current and the secondary current, based on the first communication and the second communication between the source and the instrument.

In an option of the method, not shown in detail, it is further provided:

Calculating the primary current in the structure by the field measured with the at least three sensors and as well as the phase shift, based on the first communication and the second communication between the source and the instrument;

Modelling the field measured by the at least three sensors taking into account the first phase shift, the second phase shift and a third phase shift that allow to assess the contribution of a metallic component to the measured fields; and Calculating the primary current in the structure based on the modelled field distribution.

In an option of the method, not shown in detail, it is further provided:

Calculating the first potential, the second potential and the third potential for the first frequency, second frequency and the third frequency along the structure by the following steps:

Calculating the longitudinal resistivity based on the type of metal and the metallic section of the structure; and Calculating the first potential, second potential and the third potential along the structure by the primary current for at least the first frequency and the second frequency and the third frequency. The calculation of the first amplitude and the second amplitude and the third amplitude of the primary current for the first frequency and the second frequency and the third frequency along the structure is assessed with the at least three sensors.

In an option of the method, not shown in detail, it is further provided:

Calculating of the first amplitude and the second amplitude and the third amplitude of the secondary current passing from the structure through the holiday into the electrolyte by the fields measured with the at least three sensors as well as the phase shift and by the following steps:

Modelling the secondary field measured by the at least three sensors taking into account the first phase shift, the second phase shift and a third phase shift that allows to assess the contribution of a metallic component to the measured field; and Calculating the first amplitude and the second amplitude and the second amplitude of the secondary current for the at least three frequencies passing from the structure through the holiday into the electrolyte. Additional sensors are provided at an angle to the first sensor.

In an option of the method, not shown in detail, it is further provided:

Determining of the presence of a protective layer in the holiday, based on a determination of a first impedance and a second impedance and a third impedance and the first phase shift and the second phase shift and the third phase shift, by the following steps:

Calculating the first impedance and the second impedance and the third impedance of the holiday by dividing the first potential on the structure at the position of the holiday by the first amplitude of the secondary current, by dividing the second potential on the structure at the position of the holiday by the second amplitude of the secondary current and by dividing the third potential on the structure at the position of the holiday by the third amplitude of the secondary current for the least three frequencies; and Evaluating of the frequency dependency of the first impedance and the second impedance and the third impedance and the first phase shift and the second phase shift and the third phase shift for the assessment of the presence of the protective layers within the holiday.

In an option of the method, not shown in detail, it is further provided:

Demonstrating of the good bedding condition of the holiday, based on the change of the amplitude to the amplitude of the primary current generated by the source based on the first communication and the second communication with the instrument, by the following steps with a first amplitude being applied:

Determining the first impedance and the second impedance and the third impedance of the holiday at the amplitude;

Sending a command from the instrument to the source via the first communication and the second communication, wherein the amplitude An of the primary current is increased to an increased amplitude An';

Determining the first impedance and the second impedance and the third impedance of the holiday at the increased amplitude An' as a function of time;

Sending a command from the instrument to the source via the first communication and the second communication, wherein the increased amplitude An' of the primary current is decreased to the amplitude An. The first impedance and the second impedance and the third impedance of the holiday are determined at the amplitude;

Evaluating the time evolution of the first impedance and/or the second impedance and/or the third impedance; wherein a first impedance and/or a second impedance and/or a third impedance that varies with time is a demonstration of a good bedding condition and an ability to accumulate hydroxide ions and thereby generate a zone with high pH, a zone with increased pH and a zone with small increase of pH.

In an option of the method, not shown in detail, it is further provided:

Demonstrating the presence of a protective layer on the structure in contact with the electrolyte within the holiday, based on the change of the first amplitude of the primary current generated by the source based on the first communication and the second communication with the instrument, by the following steps:

Setting the amplitude of the selected first frequency to the first amplitude;

Determining the secondary field by the at least three sensors with a frequency of at least four times of the first frequency;

Calculating the first amplitude of the secondary current;

Determining the average of the first amplitude over a multiple of the period of 1/first frequency resulting in a first apparent DC current at the first amplitude;

Changing the amplitude of the selected first frequency to the first amplitude; the secondary field is determined by the at least three sensors with a frequency of at least four times the first frequency;

Averaging the recorded data taken over a multiple of the period of 1/first frequency resulting in the first apparent DC current at the changed first amplitude; and Determining a presence of the protective layer by an evaluation of the assessment of the first amplitude subtracted by the changed first amplitude and the first apparent DC current subtracted by the changed first apparent DC current.

In an option of the method, not shown in detail, it is further provided:

Minimizing the touch potential of a pipeline during the measurement, based on the change of the first amplitude and the second amplitude and the third amplitude of the primary current for all of the at least three frequencies generated by the source based on the first communication and the second communication with the instrument, by the following step:

Temporarily changing the first amplitude and the second amplitude and the third amplitude, the first duration and the second duration and the third duration and the first time gap and the second time gap and the third time gap of the at least three frequencies by increasing the first amplitude and the second amplitude and the third amplitude and increasing the first time gap and the second time gap and the third time gap as well as decreasing the first duration and the second duration and the third duration by the first communication and the second communication between the source and the instrument.

Also, the following items are provided:

A) A method for localizing a structure 1 and determining the distance 14 in an electrolyte 2 including the steps of:

connecting a source 5 between the structure 1 and an earth 6; and imposing current 7 with at least three frequencies, i.e. frequency f1, frequency f2 and frequency f3 of duration tc1, duration tc2 and duration tc3 and of amplitude A1, amplitude A2 and amplitude A3;

wherein a series of AC currents with frequency f1, frequency f2 and frequency f3 are separated by the time gap tg;

wherein a primary field 8 of the frequency f1, frequency f2 and frequency f3 generated by the current 7 is measured with an instrument 20 comprising at least three sensors 10, 12 and 12' and a PS 45, by the following steps:

the time synchronization between the source 5 is established with communication 41 and the instrument 20 with communication 42;

the field 8 is measured for frequency f1 for a duration of up to tc1 with sensor 10, with sensor 12' and with sensor 12" with a rate of at least 4*f1; and the field 8 is measured for frequency f2 for a duration of up to tc2 with sensor 10, with sensor 12' and with sensor 12" with a rate of at least 4*f2.

B) The method according to item A), wherein the at least three sensors 17, 18' and 18" that are at an angle 21 to the sensor 10 allow for identifying a holiday 16 by detection of the field 22 generated by the current 15 of the frequency f1 and the frequency f2 and the frequency f2.

C) The method according to item A) or B), wherein further comprising the additional sensor 23 positioned at an angle 24 to the plane described by the sensor 10 and sensor 17 allowing for the detection of the field 8 as well as the field 22 in all three spatial coordinates. These three sensors 10, 17 and 23 are combined into a sensor array 25.

D) The method according to one of items A) to C), wherein the combination of at least three sensor arrays 25, 26 and 27 into the instrument 20 allowing for determining the field 8 and the field 22 generated by the current 7 and the current 15 passing through the holiday 16 from the structure 1 into the electrolyte 2 for at least frequency f1 and F2 at least every 100 cm along the structure 1. The determination of the field 22 allows for identification of the position of the holiday 16. The precision of detection is increased with decreasing the distance for individual measurements of the field 8 and the field 22 along the structure 1 from 100 cm to 1 cm.

E) The method according to one of items A) to D), wherein the communication 41 and communication 42 between the source 5 and the instrument 20 that allows for the measurement of the phase shift DEG1 and DEG 2 and DEG3 of the at least three frequencies f1, f2 and f3 imposed by the source 5 and the field 8 as well as the field 22 generated by the current 7 and the current 15.

F) The method according to item A), wherein the communication 41 and communication 42 between the source 5 and the instrument 20 that allows for calculation of the current 7' in the structure 1 by the field 8 measured with the at least three sensors 10, 12' and 12" as well as the phase shift DEG1 and DEG2 and DEG3 by the following steps:

The field 8 measured by the at least three sensors 10, 12' and 12" is modelled taking into account the phase shift DEG1 and DEG2 and DEG3 that allows to assess the contribution of a metallic component 30 to the measured field 8; and Calculation of the current 7' in the structure 1 based on the modelled field distribution.

G) The method according to item A) or F), wherein the calculation of the amplitude A1 and A2 and A3 of current 7 for frequency f1 and f2 along the structure 1 assessed with at least three sensors 10, 12 and 12' allows for the calculation of the potential U1 and U2 and U3 for the frequency f1 and f2 and f3 along the structure 1 by the following steps:

Based on the type of metal and the metallic section of the structure 1, the longitudinal resistivity is calculated.

By the current 7' for at least frequency f1 and frequency f2 and frequency f3, the potential U1 and U2 and U3 is calculated along the structure 1.

H) The method according to one of items A), B), E), F) and G), wherein sensors 17, 18 and 18' that are at an angle 21 to sensor 10 allows for the calculation of the amplitude A1 and A2 and A3 of the current 15 passing from the structure 1 through the holiday 16 into the electrolyte 2 by the field 22 measured with the at least three sensors 17, 18 and 18' as well as the phase shift DEG1 and DEG2 and DEG3 by the following steps:

The field 22 measured by the at least three sensors 17, 18 and 18' is modelled taking into account the phase shift DEG1 and DEG2 and DEG3 that allows to assess the contribution of a metallic component 30 to the measured field 22.

Calculation of the amplitude A1 and A2 and A3 of the secondary current 15 for the at least three frequencies f1, f2 and f3 passing from the structure 1 through the holiday 16 into the electrolyte 2.

I) The method according to one of items A) to H), wherein determination of the Impedance Z1 and Z2 and Z3 and the phase shift DEG1 and DEG2 and DEG3 allows for the determination of the presence of a protective layer 32 in the holiday 16 by the following steps:

The impedance Z1 and Z2 and Z3 of the holiday 16 is calculated by dividing the potential U1 on the structure 1 at the position of the holiday 16 by A1 of current 15 and by dividing the potential U2 on the structure 1 at the position of the holiday 16 by A2 of current 15 and by dividing the potential U3 on the structure 1 at the position of the holiday 16 by A3 of current 15 for the least three frequencies f1, f2 and f3.

Evaluation of the frequency dependence of the impedance Z1 and Z2 and Z3 and the phase shift DEG1 and DEG2 and DEG3 for the assessment of the presence of the protective layers 32 within the holiday 16. This provides information with respect to the corrosion protection of the holiday.

J) The method according to one of items A) to I), wherein the change of A0 to A0' of the current 7 generated by the source 5 based on communication 41 and communication 42 with the instrument 20 allows for demonstration of the good bedding condition of the holiday 16 by the following steps with A0 being applied:

The impedance Z1 and Z2 and Z3 of the holiday 16 are determined at A0.

Via communication 41 and communication 42 a command is sent from the instrument 20 to the source 5 and A0 of current 7 is increased to A0'.

The impedance Z1' and Z2' and Z3' of the holiday 16 are determined at A0' as a function of time.

Via communication 41 and communication 42 a command is sent from the instrument 20 to the source 5 and A0' of current 7 is decreased to A0.

The impedance Z1" and Z2" and Z3" of the holiday 16 is determined at A0.

The time evolution of the impedance Z1' and/or Z2' and/or Z3' is evaluated: A Z1' and/or Z2' and/or Z3' that varies with time is a demonstration of good bedding condition and the ability to accumulate hydroxide ions increase the pH and thereby generate a zone 33 with high pH, a zone 34 with increased pH and a zone 35 with small increase of pH. The generation of zone 33, 34 and 35 results in Z1 and Z2 and Z3 being different to Z1" and Z2" and Z3".

K) The method according to one of items A) to J), wherein the change of the amplitude A1 of the current 7 generated by the source 5 based on communication 41 and communication 42 with the instrument 20 that allows for demonstration of the presence of a protective layer 32 on the structure 1 in contact with the electrolyte 2 within the holiday 16 by the following steps:

The amplitude of the selected frequency f1 of the primary current is set to A1.

The field 15 is determined by the at least three sensors 17, 18' and 18" with a frequency of at least 4*f1.

The amplitude A1 of the secondary current 15 is calculated.

The average of A1 determined over a multiple of the period of 1/f1 is averaged resulting in ADC1 at A1.

The amplitude of the selected frequency f1 is changed to A1'.

The secondary field 15 is determined by the at least three sensors 17, 18' and 18" with a frequency of at least 4*f1.

The average of the recorded data taken over a multiple of the period of 1/f1 is averaged resulting in ADC1' at A1'.

The presence of the protective layer 32 is determined by the evaluation of the assessment of A1-A1' and ADC1-ADC1'.

L) The method according to one of items A) to K), wherein the change of the amplitude A1 and A2 and A3 of the primary current 7 for all of the at least three frequencies f1, f2 and f3 generated by the source 5 based on communication 41 and communication 42 with the instrument 20 that allows to minimize the touch potential of the pipeline during the measurement by the following steps:

The determination of the secondary current 15 passing from the structure 1 through the holiday 16 into the electrolyte 2 does not provide sufficient resolution for reliable calculation of the impedance Z1 and Z2 and Z3 or the phase shift DEG1 and DEG2 and DEG3.

The amplitude A1 and A2 and A3, the duration tc1 and tc2 and tc3 and the time gap tg1 and tg2 and tg3 of the at least three frequencies f1, f2 and f3 is temporarily changed by increasing A1' and A2' and A3' and increasing to tg1' and tg2' and tg3' as well as decreasing to tc1' and tc2' and tc3' by the communication 41 and communication 42 between the source 5 and the instrument 20.

This procedure allows for significantly increased short term levels of U1 and U2 and U3 on the pipeline without generating a problem with respect to protection of persons or AC corrosion.

M) A system for localizing the structure 1, identifying holidays 16 on the structure 1, determining the presence of protective layers 32, the good bedding of the holiday 16 and therefore the external corrosion assessment of a structure in contact with an electrolyte 2, e.g. for performing the method according to one of items A) to L), wherein the system comprises:

an instrument 20 with:

at least three sensor arrays 25, 26 and 27 allowing for measurement of the field 8 and the field 22 along the structure 1 in all three spatial coordinates;

at least one communication 42;

a positioning and orientation system 45;

a source 5 with an electrical output connecting to an earth 6; and an electrical output connecting to a structure 1 and a communication 41.

In another exemplary embodiment of the present invention, a computer program or a computer program element is provided that is characterized by being adapted to execute the method steps of the method according to one of the preceding embodiments, on an appropriate system.

The computer program element might be stored on a computer unit or be distributed over more than one computer units, which might also be part of an embodiment of the present invention. This computing unit may be adapted to perform or induce a performing of the steps of the method described above. Moreover, it may be adapted to operate the components of the above described apparatus. The computing unit can be adapted to operate automatically and/or to execute the orders of a user. A computer program may be loaded into a working memory of a data processor. The data processor may thus be equipped to carry out the method of the invention.

Aspects of the invention may be implemented in a computer program product, which may be a collection of computer program instructions stored on a computer readable storage device which may be executed by a computer. The instructions of the present invention may be in any interpretable or executable code mechanism, including but not limited to scripts, interpretable programs, dynamic link libraries (DLLs) or Java classes. The instructions can be provided as complete executable programs, partial executable programs, as modifications to existing programs (e.g. updates) or extensions for existing programs (e.g. plugins). Moreover, parts of the processing of the present invention may be distributed over multiple computers or processors.

As discussed above, the processing unit, for instance a controller implements the control method. The controller can be implemented in numerous ways, with software and/or hardware, to perform the various functions required. A processor is one example of a controller which employs one or more microprocessors that may be programmed using software (e.g., microcode) to perform the required functions. A controller may however be implemented with or without employing a processor, and also may be implemented as a combination of dedicated hardware to perform some functions and a processor (e.g., one or more programmed microprocessors and associated circuitry) to perform other functions.

Examples of controller components that may be employed in various embodiments of the present disclosure include, but are not limited to, conventional microprocessors, application specific integrated circuits (ASICs), and field-programmable gate arrays (FPGAs).

This exemplary embodiment of the invention covers both, a computer program that right from the beginning uses the invention and a computer program that by an update turns an existing program into a program that uses the invention.

Further on, the computer program element might be able to provide all necessary steps to fulfil the procedure of an exemplary embodiment of the method as described above.

According to a further exemplary embodiment of the present invention, a computer readable medium, such as a CD-ROM, is presented wherein the computer readable medium has a computer program element stored on it, which computer program element is described by the preceding section. A computer program may be stored and/or distributed on a suitable medium, such as an optical storage medium or a solid-state medium supplied together with or as part of other hardware, but may also be distributed in other forms, such as via the internet or other wired or wireless telecommunication systems.

However, the computer program may also be presented over a network like the World Wide Web and can be downloaded into the working memory of a data processor from such a network. According to a further exemplary embodiment of the present invention, a medium for making a computer program element available for downloading is provided, which computer program element is arranged to perform a method according to one of the previously described embodiments of the invention.

It has to be noted that embodiments of the invention are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A method for assessing a structure arranged in an electrolyte, the method comprising the steps:
   connecting an electric source between the structure and an earth;
   imposing, on the structure, a primary current with at least three frequencies comprising a first frequency of a first duration and of a first amplitude, a second frequency of a second duration and of a second amplitude and a third frequency of a third duration and of a third amplitude; wherein a series of currents with the first frequency, the second frequency and the third frequency are separated by a time gap;
   measuring of fields with an instrument comprising at least a first sensor, a third sensor and a fourth sensor and a positioning system; wherein each sensor is configured to measure a field along the structure for each of the at least three frequencies; and
   computing at least one primary field resulting from an electric current within the structure based on the measured field.

2. The method according to claim 1, further comprising:
   locating the structure by detecting a primary field generated by a primary current of the first frequency, the second frequency and the third frequency within the structure.

3. The method according to claim 1, further comprising:
   identifying a holiday by detecting a secondary field generated by a secondary current of the first frequency, the second frequency and the third frequency.

4. The method according to claim 1, further comprising:
   establishing a time synchronization between the source and the instrument.

5. The method according to claim 1, wherein for measuring, the following steps are provided:

establishing a time synchronization between the source with a first communication and an instrument with a second communication;

measuring a field for the first frequency for a duration of up to a first duration with the first sensor, the third sensor and the fourth sensor with a rate of at least four times the first frequency; and measuring a field for the second frequency for a duration of up to the second duration with the first sensor, the third sensor and the fourth sensor with a rate of at least four times the second frequency; and measuring a field for the third frequency for a duration of up to a third duration with the first sensor, the third sensor and the fourth sensor with a rate of at least four times the third frequency; and calculating at least one physical property for the structure based on the measured fields.

6. The method according to claim 1, further comprising: determining of at least one local phase to identify and localize a holiday within the structure.

7. The method according to claim 6, wherein, to determine of the at least one local phase, a predefined model is provided for computing the at least one local phase based on the measured fields.

8. The method according to claim 6, wherein, to determine of the at least one local phase, the at least one local phase is computed based on measured phase shifts.

9. The method according to claim 1, further comprising: measuring of a first phase shift, a second phase shift and a third phase shift of the at least three frequencies imposed by the source and the measured field by the first sensor, the third sensor and the fourth sensor generated by the primary current and the secondary current, based on the first communication and the second communication between the source and the instrument.

10. The method according to claim 1, further comprising: calculating the primary current in the structure by the field measured with the at least three sensors and as well as the phase shift, based on the first communication and the second communication between the source and the instrument;

modelling the field measured by the at least three sensors taking into account the first phase shift, the second phase shift and a third phase shift that allow to assess the contribution of a metallic component to the measured field; and calculating the primary current in the structure based on the modelled field distribution.

11. The method according to claim 1, further comprising: calculating the first potential, the second potential and the third potential for the first frequency, the second frequency and the third frequency along the structure by the following steps:

calculating the longitudinal resistivity based on the type of metal and the metallic section of the structure; and calculating the first potential, the second potential and the third potential along the structure by the primary current for at least the first frequency, the second frequency and the third frequency;

wherein the calculation of the first amplitude, the second amplitude and the third amplitude of the primary current for the first frequency, the second frequency and the third frequency along the structure is assessed with the at least three sensors.

12. The method according to claim 1, further comprising: calculating of the first amplitude, the second amplitude and the third amplitude of the secondary current passing from the structure through the holiday into the electrolyte by the fields measured with the at least three sensors as well as the phase shift and by the following steps:

modelling the secondary field measured by the at least three sensors taking into account the first phase shift, the second phase shift and the third phase shift that allows to assess the contribution of a metallic component to the measured field; and calculating the first amplitude and the second amplitude of the secondary current for the at least three frequencies passing from the structure through the holiday into the electrolyte;

wherein additional sensors are provided at an angle to the first sensor.

13. The method according to claim 1, further comprising: determining of the presence of a protective layer in the holiday, based on a determination of a first impedance, a second impedance and third impedance and the first phase shift, the second phase shift and third phase shift, by the following steps:

calculating the first impedance, the second impedance and the third impedance of the holiday by dividing the first potential on the structure at the position of the holiday by the first amplitude of the secondary current, by dividing the second potential on the structure at the position of the holiday by the second amplitude of the secondary current and by dividing the third potential on the structure at the position of the holiday by the third amplitude of the secondary current for the least three frequencies; and evaluating of the frequency dependency of the first impedance, the second impedance and the third impedance and the first phase shift the second phase shift and the third phase shift for the assessment of the presence of the protective layers within the holiday.

14. The method according to claim 1, further comprising: demonstrating of the good bedding condition of the holiday, based on the change of the amplitude to the amplitude of the primary current generated by the source based on the first communication and the second communication with the instrument, by the following steps with a first amplitude being applied:

determining at least the first impedance of the holiday at the amplitude;

sending a command from the instrument to the source via the first communication and the second communication, wherein the amplitude of the primary current is increased to an increased amplitude;

determining at least the first impedance of the holiday at the increased amplitude as a function of time;

sending a command from the instrument to the source via the first communication and the second communication, wherein the increased amplitude of the primary current is decreased to the amplitude;

wherein at least the first impedance of the holiday are determined at the amplitude; and evaluating the time evolution of at least the first impedance; wherein at least a first impedance that varies with time is a demonstration of a good bedding condition and an ability to accumulate hydroxide ions and thereby generate a zone with high pH, a zone with increased pH and a zone with small increase of pH;

wherein the generation of the zones results at least in the first impedances being different at different amplitudes.

15. The method according to claim 1, further comprising: demonstrating the presence of a protective layer on the structure in contact with the electrolyte within the holiday, based on the change of the first amplitude of the primary current generated by the source based on the first communication and the second communication with the instrument, by the following steps:

setting the amplitude of the selected first frequency to the first amplitude;

determining the secondary field by the at least three sensors with a frequency of at least four times of the first frequency;

calculating the first amplitude of the secondary current;

determining the average of the first amplitude over a multiple of the period of 1/first frequency resulting in a first apparent DC current at the first amplitude;

changing the amplitude of the selected first frequency to the first amplitude;

wherein the secondary field is determined by the at least three sensors with a frequency of at least four times the first frequency;

averaging the recorded data taken over a multiple of the period of 1/first frequency resulting in the first apparent DC current at the changed first amplitude; and determining a presence of the protective layer by an evaluation of the assessment of the first amplitude subtracted by the changed first amplitude and the first apparent DC current subtracted by the changed first apparent DC current.

16. The method according to claim 1, further comprising: minimizing the touch potential of a pipeline during the measurement, based on the change of at least the first amplitude of the primary current for all of the at least first frequencies generated by the source based on the first communication and the second communication with the instrument, by the following step:

temporarily changing at least the first amplitude, at least the first duration or at least the first time gap of the at least three frequencies by increasing at least the first amplitude or increasing at least the first time gap or at decreasing at least the first duration by the first communication and the second communication between the source and the instrument.

17. A system for assessing a structure arranged in an electrolyte, the system comprising:

a source with an electric output terminal configured for connection to the structure, an electric output terminal configured for connection to earth;

wherein the source is configured to provide a current with at least three frequencies at least within the structure; and an instrument with at least a first sensor, a second sensor and a third sensor in a known spatial relation;

wherein each sensor is configured to measure a field along the structure for each of the at least three frequencies;

a positioning and orientation system configured to provide position data of the instrument; and a processing unit in data communication with the source and the instrument;

wherein the processing unit is configured to compute at least one primary field resulting from an electric current within the structure based on the measured field.

18. The system according to claim 17, wherein the source is configured to provide the current as a primary current with at least three frequencies comprising a first frequency of a first duration and of a first amplitude, a second frequency of a second duration and of a second amplitude and a third frequency of a third duration and of a third amplitude; wherein a series of currents with the first frequency, the second frequency and the third frequency are separated by a time gap.

19. The system according to claim 17, wherein the instrument measures at least three different fields at each of the at least three sensors for the at three frequencies.

20. The system according to claim 17, wherein a seventh sensor and a twelfth sensor are combined with the first sensor, forming a first sensor array;

wherein the seventh sensor is at an angle to the first sensor and the twelfth sensor is at an angle to the plane described by the first and the seventh sensor.

* * * * *